(12) United States Patent
Shimazaki

(10) Patent No.: US 6,321,168 B1
(45) Date of Patent: Nov. 20, 2001

(54) MEANS OF CALCULATING POWER CONSUMPTION CHARACTERISTIC AND METHOD THEREOF

(75) Inventor: Kenji Shimazaki, Hirakata (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/233,333

(22) Filed: Jan. 20, 1999

(30) Foreign Application Priority Data

Jan. 21, 1998 (JP) .................................................. 10-009466

(51) Int. Cl.⁷ ........................................................ G06F 17/00
(52) U.S. Cl. ................................... 702/60; 702/57; 702/62
(58) Field of Search ................................. 702/57, 60, 62; 703/2, 18; 716/2, 12, 18

(56) References Cited

U.S. PATENT DOCUMENTS

| | | | |
|---|---|---|---|
| 5,847,966 | * 12/1998 | Uchino et al. | ............................ 716/2 |
| 5,966,523 | * 10/1999 | Uchino et al. | ............................ 703/2 |
| 6,075,932 | * 6/2000 | Khouja et al. | ......................... 702/60 |

FOREIGN PATENT DOCUMENTS 5-165912    7/1993    (JP) .

OTHER PUBLICATIONS

"CB–Power: A Hierarchical Cell–Based Power Characterization and Estimation Environment For Static CMOS Circuits"; Wen–Zen Shen et al.; Department of Electronics Engineering & Institute of Electronics, National Chiao Tung University, Taiwan, R.O.C.

* cited by examiner

Primary Examiner—Marc S. Hoff
Assistant Examiner—Bryan Bui
(74) Attorney, Agent, or Firm—Parkhurst & Wendel, L.L.P.

(57) ABSTRACT

A method for calculating a power consumption library on a gate level in a large-scale transistor circuit. The method includes: dividing a circuit network into a partial circuit network by a gate terminal of a transistor, calculating a relation of an input logical value to an output logical value in a partial circuit; calculating a relation of an output logical value to an input logical change in an output wiring between partial circuits, based on a partial circuit connection and a relation of an input logical value to an output logical value in a partial circuit; measuring a partial circuit power consumption by using an input logical change in each partial circuit; and regarding the sum of a power consumption at each partial circuit corresponding to an input logical change as a power consumption in a circuit network. The method also provides for reuse when a current path is the same in a circuit input logical change. The calculation also involves regarding the transistor as the same when a transistor with the same current characteristic is arrayed in the same order on the path even if a current path is different.

35 Claims, 36 Drawing Sheets

| input logical value | | output logical value |
|---|---|---|
| IN1 | IN2 | N11 |
| 0 | 0 | 1 |
| 0 | 1 | 1 |
| 1 | 0 | 1 |
| 1 | 1 | 0 |

301
305
303

P02

| input logical value | | | output logical value |
|---|---|---|---|
| IN1 | IN2 | N11 | OUT |
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 1 |
| 1 | 1 | 1 | 0 |

| partial circuit input number | input logical change | | | |
|---|---|---|---|---|
| | logical value before change | | logical value after change | |
| | IN1 | IN2 | IN1 | IN2 |
| 1 | 0 | 0 | 1 | 1 |
| 2 | 0 | 1 | 1 | 1 |
| 3 | 1 | 0 | 1 | 1 |
| 4 | 1 | 1 | 0 | 0 |
| 5 | 1 | 1 | 0 | 1 |
| 6 | 1 | 1 | 1 | 0 |

P02 402

| partial circuit input number | input logical change | | | | | |
|---|---|---|---|---|---|---|
| | logical value before change | | | logical value after change | | |
| | IN1 | IN2 | N11 | IN1 | IN2 | N11 |
| 1 | 0 | 0 | 1 | 0 | 1 | 1 |
| 2 | 0 | 0 | 1 | 1 | 0 | 1 |
| 3 | 0 | 1 | 1 | 0 | 0 | 1 |
| 4 | 0 | 1 | 1 | 1 | 1 | 0 |
| 5 | 1 | 0 | 1 | 0 | 0 | 1 |
| 6 | 1 | 0 | 1 | 1 | 1 | 0 |
| 7 | 1 | 1 | 0 | 0 | 1 | 1 |
| 8 | 1 | 1 | 0 | 1 | 0 | 1 |

| partial circuit input number | current path |
|---|---|
| 1 | VDD1 → TP11/TP12 →N11/ TN11 → TN12 → GND1 |
| 2 | VDD1 → TP11 →N11/ TN11 → TN12 → GND1 |
| 3 | VDD1 → TP12 →N11/ TN11 → TN12 → GND1 |
| 4 | VDD1 → TP11/TP12 → N11/TN11 → TN12 → GND1 |
| 5 | VDD1 → TP11 → N11/TN11 → TN12 → GND1 |
| 6 | VDD1 → TP12 → N11/TN11 → TN12 → GND1 |

P02  /502

| partial circuit input number | current path |
|---|---|
| 1 | VDD2 → TP21 → TP22 → OUT/TN23 → TN22 → GND2 |
| 2 | VDD2 → TP21 → TP22 → OUT/TN23 → TN21 → GND2 |
| 3 | VDD2 → TP21 → TP22 → OUT/TN23 → TN22 → GND2 |
| 4 | VDD2 → TP23 → OUT/TN23 → TN21/TN22 → GND2 |
| 5 | VDD2 → TP21 → TP22 → OUT/TN23 → TN21 → GND2 |
| 6 | VDD2 → TP23 → OUT/TN23 → TN21/TN22 → GND2 |
| 7 | VDD2 → TP23 → OUT/TN23 → TN21/TN22 → GND2 |
| 8 | VDD2 → TP23 → OUT/TN23 → TN21/TN22 → GND2 |

FIG. 6
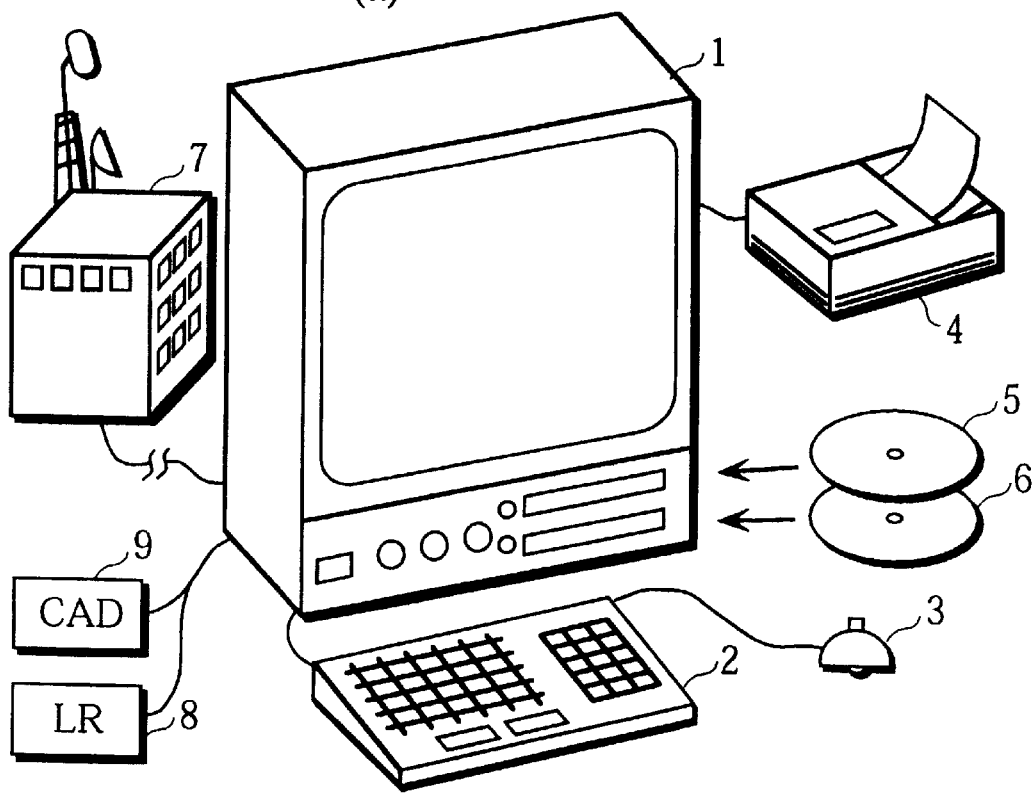
(a)
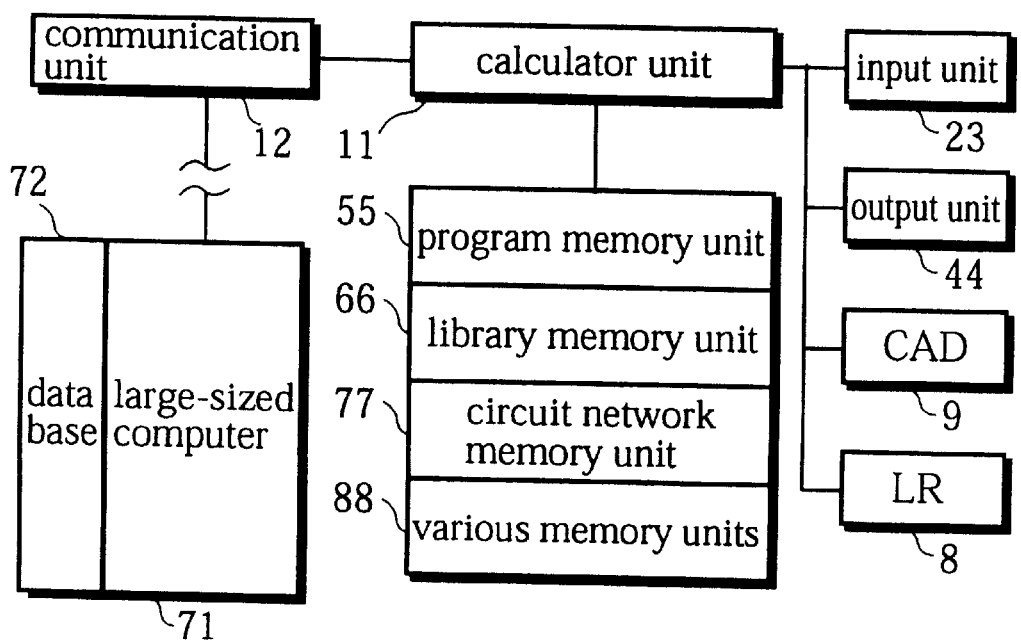
(b)

FIG. 10

| number | TP1 | ... | TN1 | ... | N1·2 | ... | C1 | ... |
|---|---|---|---|---|---|---|---|---|
| TP1 | | ... | ○ | ... | ○ | ... | ○ | ... |
| ⋮ | ⋮ | | ... | ... | ... | ... | | ... |
| TN1 | ○ | | | ... | — | ... | ○ | ... |
| ⋮ | ⋮ | ⋮ | ⋮ | | ... | ... | ... | ... |
| N1·2 | ○ | ⋮ | \| | ⋮ | | ... | — | ... |
| ⋮ | ⋮ | ⋮ | ⋮ | ⋮ | ⋮ | | ... | ... |
| C1 | ○ | ⋮ | ○ | ⋮ | — | ⋮ | | ... |
| ⋮ | ⋮ | ⋮ | ⋮ | ⋮ | ⋮ | ⋮ | ⋮ | |

FIG. 11
(a)

| number | 1 | 2 | 3 | ... | I |
|---|---|---|---|---|---|
| 1 |  | 1·2 | — | ... | 1·I |
| 2 | 1·2 |  | 2·3 | ... | — |
| 3 | · | 2·3 |  | ... | — |
| ⋮ | ⋮ | ⋮ | ⋮ |  | ... |
| I | 1·I | — | — | ⋮ |  |

(b)

| number | 1·2 | ... | 2·3 | ... | (J−1)·J |
|---|---|---|---|---|---|
| contents of connection | N1·2 | ... | A2·3 | ... | ... |

FIG. 12

| element | condition 1 | condition 2 | ... |
|---------|-------------|-------------|-----|
| TP1 | R=1, C=·· | R=2, C=·· | ... |
| ... | ... | ... | ... |
| TP2 | R=0.2, C=·· | R=2, C=·· | ... |
| ... | ... | ... | ... |
| C1 | R=0, C=·· | R=0, C=·· | ... |
| ... | ... | ... | ... |

FIG. 15

| circuit input number | input logical value before change | | input logical value after change | |
|---|---|---|---|---|
| | IN1 | IN2 | IN1 | IN2 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 1 | 0 |
| 6 | 0 | 1 | 1 | 1 |
| 7 | 1 | 0 | 0 | 0 |
| 8 | 1 | 0 | 0 | 1 |
| 9 | 1 | 0 | 1 | 1 |
| 10 | 1 | 1 | 0 | 0 |
| 11 | 1 | 1 | 0 | 1 |
| 12 | 1 | 1 | 1 | 0 |

| circuit input number | input logical change | | | | output logical change | |
|---|---|---|---|---|---|---|
| | logical value before change | | logical value after change | | logical value before change | logical value after change |
| | IN1 | IN2 | IN1 | IN2 | N11 | N11 |
| 1 | 0 | 0 | 0 | 1 | 1 | 1 |
| 2 | 0 | 0 | 1 | 0 | 1 | 1 |
| 3 | 0 | 0 | 1 | 1 | 1 | 0 |
| 4 | 0 | 1 | 0 | 0 | 1 | 1 |
| 5 | 0 | 1 | 1 | 0 | 1 | 1 |
| 6 | 0 | 1 | 1 | 1 | 1 | 0 |
| 7 | 1 | 0 | 0 | 0 | 1 | 1 |
| 8 | 1 | 0 | 0 | 1 | 1 | 1 |
| 9 | 1 | 0 | 1 | 1 | 1 | 0 |
| 10 | 1 | 1 | 0 | 0 | 0 | 1 |
| 11 | 1 | 1 | 0 | 1 | 0 | 1 |
| 12 | 1 | 1 | 1 | 0 | 0 | 1 |

P02 2002

| circuit input number | input logical change | | | | | | output logical change | |
|---|---|---|---|---|---|---|---|---|
| | logical value before change | | | logical value after change | | | logical value before change | logical value after change |
| | IN1 | IN2 | N11 | IN1 | IN2 | N11 | OUT | OUT |
| 1 | 0 | 0 | 1 | 0 | 1 | 1 | 1 | 0 |
| 2 | 0 | 0 | 1 | 1 | 0 | 1 | 1 | 0 |
| 3 | 0 | 0 | 1 | 1 | 1 | 0 | 1 | 1 |
| 4 | 0 | 1 | 1 | 0 | 0 | 1 | 0 | 1 |
| 5 | 0 | 1 | 1 | 1 | 0 | 1 | 0 | 0 |
| 6 | 0 | 1 | 1 | 1 | 1 | 0 | 0 | 1 |
| 7 | 1 | 0 | 1 | 0 | 0 | 1 | 0 | 1 |
| 8 | 1 | 0 | 1 | 0 | 1 | 1 | 0 | 0 |
| 9 | 1 | 0 | 1 | 1 | 1 | 0 | 0 | 1 |
| 10 | 1 | 1 | 0 | 0 | 0 | 1 | 1 | 1 |
| 11 | 1 | 1 | 0 | 0 | 1 | 1 | 1 | 0 |
| 12 | 1 | 1 | 0 | 1 | 0 | 1 | 1 | 0 |

| circuit input number | partial circuit input number |
|---|---|
| 1 | - |
| 2 | - |
| 3 | 1 |
| 4 | - |
| 5 | - |
| 6 | 2 |
| 7 | - |
| 8 | - |
| 9 | 3 |
| 10 | 4 |
| 11 | 5 |
| 12 | 6 |

P02 — 2102

| circuit input number | partial circuit input number |
|---|---|
| 1 | 1 |
| 2 | 2 |
| 3 | - |
| 4 | 3 |
| 5 | - |
| 6 | 4 |
| 7 | 5 |
| 8 | - |
| 9 | 6 |
| 10 | - |
| 11 | 7 |
| 12 | 8 |

| partial circuit input number | power consumption |
|---|---|
| 1 | 80 |
| 2 | 90 |
| 3 | 90 |
| 4 | 100 |
| 5 | 70 |
| 6 | 70 |

231

P02

| partial circuit input number | power consumption |
|---|---|
| 1 | 90 |
| 2 | 90 |
| 3 | 140 |
| 4 | 100 |
| 5 | 140 |
| 6 | 100 |
| 7 | 150 |
| 8 | 150 |

| circuit input number | partial circuit input number |
|---|---|
| 1 | - |
| 2 | - |
| 3 | 1 |
| 4 | - |
| 5 | - |
| 6 | 2 |
| 7 | - |
| 8 | - |
| 9 | 3 |
| 10 | 4 |
| 11 | 5 |
| 12 | 6 |

P02    2802

| circuit input number | partial circuit input number |
|---|---|
| 1 | 1 |
| 2 | 2 |
| 3 | - |
| 4 | 3 |
| 5 | - |
| 6 | 4 |
| 7 | 5 |
| 8 | - |
| 9 | 4 |
| 10 | - |
| 11 | 7 |
| 12 | 7 |

| partial circuit input number | input logical change | | | |
|---|---|---|---|---|
| | logical value before change | | logical value after change | |
| | IN1 | IN2 | IN1 | IN2 |
| 1 | 0 | 0 | 1 | 1 |
| 2 | 0 | 1 | 1 | 1 |
| 3 | 1 | 0 | 1 | 1 |
| 4 | 1 | 1 | 0 | 0 |
| 5 | 1 | 1 | 0 | 1 |
| 6 | 1 | 1 | 1 | 0 |

P02 — 2902

| partial circuit input number | input logical change | | | | | |
|---|---|---|---|---|---|---|
| | logical value before change | | | logical value after change | | |
| | IN1 | IN2 | N11 | IN1 | IN2 | N11 |
| 1 | 0 | 0 | 1 | 0 | 1 | 1 |
| 2 | 0 | 0 | 1 | 1 | 0 | 1 |
| 3 | 0 | 1 | 1 | 0 | 0 | 1 |
| 4 | 0 | 1 | 1 | 1 | 1 | 0 |
| 5 | 1 | 0 | 1 | 0 | 0 | 1 |
| 7 | 1 | 1 | 0 | 0 | 1 | 1 |

| partial circuit input number | power consumption |
|---|---|
| 1 | 80 |
| 2 | 90 |
| 3 | 90 |
| 4 | 100 |
| 5 | 70 |
| 6 | 70 |

3001

P02

| partial circuit input number | power consumption |
|---|---|
| 1 | 90 |
| 2 | 90 |
| 3 | 140 |
| 4 | 100 |
| 5 | 140 |
| 7 | 150 |

| circuit input number | power consumption |
|---|---|
| 1 | 90 |
| 2 | 90 |
| 3 | 80 |
| 4 | 140 |
| 5 | 0 |
| 6 | 190 |
| 7 | 140 |
| 8 | 0 |
| 9 | 190 |
| 10 | 100 |
| 11 | 220 |
| 12 | 220 |

| partial circuit input number | input logical change | | | |
|---|---|---|---|---|
| | logical value before change | | logical value after change | |
| | IN1 | IN2 | IN1 | IN2 |
| 1 | 0 | 0 | 1 | 1 |
| 3 | 1 | 0 | 1 | 1 |
| 4 | 1 | 1 | 0 | 0 |
| 6 | 1 | 1 | 1 | 0 |

P02      3302

| partial circuit input number | input logical change | | | | | |
|---|---|---|---|---|---|---|
| | logical value before change | | | logical value after change | | |
| | IN1 | IN2 | N11 | IN1 | IN2 | N11 |
| 1 | 0 | 0 | 1 | 0 | 1 | 1 |
| 3 | 0 | 1 | 1 | 0 | 0 | 1 |
| 5 | 1 | 0 | 1 | 0 | 0 | 1 |
| 7 | 1 | 1 | 0 | 0 | 1 | 1 |

| circuit input number | partial circuit input number |
|---|---|
| 1 | - |
| 2 | - |
| 3 | 1 |
| 4 | - |
| 5 | - |
| 6 | 2 |
| 7 | - |
| 8 | - |
| 9 | 2 |
| 10 | 4 |
| 11 | 5 |
| 12 | 5 |

P02 3402

| circuit input number | partial circuit input number |
|---|---|
| 1 | 1 |
| 2 | 1 |
| 3 | - |
| 4 | 3 |
| 5 | - |
| 6 | 4 |
| 7 | 3 |
| 8 | - |
| 9 | 4 |
| 10 | - |
| 11 | 7 |
| 12 | 7 |

| partial circuit input number | power consumption |
|---|---|
| 1 | 80 |
| 2 | 90 |
| 4 | 100 |
| 5 | 70 |

3501

P02

| partial circuit input number | power consumption |
|---|---|
| 1 | 90 |
| 3 | 140 |
| 4 | 100 |
| 7 | 150 |

3502

MEANS OF CALCULATING POWER CONSUMPTION CHARACTERISTIC AND METHOD THEREOF

BACKGROUND OF THE INVENTION (1) Field of the Invention

The present invention relates to making a gate (a smallest circuit component) a library, and particularly, a technique for measuring and predicting a power consumption characteristic of a gate library for a gate level simulator.

(2) Description of the Prior Arts

An estimate of a power consumption at an actual chip in a stage of designing a chip has formerly been executed as described below: treating a circuit as a connected relation on a level of each element among capacity, resistance, diode, current supply, voltage supply and the like; in addition, representing this connected relation by a library and a net list; thereunder, converting these into a relational formula between a current and a voltage; solving the relational formula between a current and a voltage through an input into a circuit by using an iterative method; and using a circuit simulator for estimating a value of a current and a voltage inside a circuit.

However, time required for the simulation increases in proportion to an input signal change column wherein a signal of ON, OFF relates to a wiring which is input from outside.

In a large-scale circuit wherein the number of transistors increases and a connection is complicated, the relational formula between a current and a voltage is complicated, whereby the time increases experientially exponentially on average.

Consequently, such a method can not be applicable to the large-scale circuit.

As an LSI is getting on a large scale in recent years, an estimate of a power consumption in the LSI has generally been executed on a level of a group of transistors and a cell, namely, a gate level simulation.

It is necessary for the estimate of a power consumption on a gate level simulation to measure and predict beforehand by a circuit simulator a corresponding relation (a relation between a circuit input and a power consumption) between an input logical change and a power consumption, which is consumed at a logical gate when the input logical change occurs, at a logical gate which is the smallest component on a gate level simulation, and thereby make the values a library.

A method of measuring and calculating a power consumption by a circuit simulator in all input logical changes regarding an input into a logical gate has generally been used for calculating the relation between a circuit input and a power consumption However, in the method, since each gate of N input gates can usually have two logical values, an input logic is made $2^N$ (the N-th power of 2). A change for the input logic is also made $2^N$, and since one of them is the same as the input logic, an input logical change of $(2^N)\times(2^N-1)$ is necessary in total. Accordingly, when the number of an input terminal at a logical gate increases, time required for an estimate of a power consumption (time required for measuring and calculating actually) is very long.

In recent years, a large-scale logical gate having a large-scale circuit and many input terminals is increasing, such as a complicated combination logical gate for using a logical composition tool efficiently and a multiplier for recycling a design. Consequently, the problem is that time required for an estimate of a power consumption increases in estimating a power consumption at such a logical gate.

For instance, in a measuring system for a power consumption parameter (hereinafter referred to as 'CB-Power'), which is written in ASP-DAC '97 3G. 1 CB-Power A Hierarchical Cell-Based Power Characterization and Estimation Environment for Static CMOS Circuits, such a method is used as described below: calculating a power consumption for all input signal changes which change an output wiring of such partial circuits as AND, OR which are used in a logical gate; making a calculated power consumption a library beforehand; and calculating a power consumption at a logical gate comprising a combination of these partial circuits by the sum of a power consumption corresponding to an input change in the partial circuit, which is caused by an input change at the logical gate.

In this method, the number of input changes in a partial circuit and partial circuits for measuring and calculating a power consumption is reduced in measuring a power consumption covering a plurality of logical gates by measuring and calculating a power consumption in only an input change which changes an output from a partial circuit among all input changes which have the possibility of an input into a partial circuit in making a, power consumption in a partial circuit a library beforehand for applying to a plurality of logical gates as well as applying a power consumption in the above-mentioned partial circuit to a partial circuit having the same constitution as the above-mentioned partial circuit in a circuit diagram of a logical gate, whereby the reduction of the time for a circuit simulation is intended.

For instance, in a circuit shown in FIG. 1, it is presumed that it takes a minute to calculate a power consumption in each of partial circuits P01 and P02 for an input logical change and two minutes to calculate a power consumption in the whole circuit.

Then, in a calculation time of a power consumption in the whole circuit, an input logical change has twelve sorts of $(2^2)\times(2^2-1)$ in a general method because of two input gates.

Since the calculation of a power consumption is executed in each circuit for two minutes, it takes twenty-four minutes in total.

Meanwhile, in a method of CB-Power, since only an input logical change which changes an output is processed, an input logical change having the sorts of (the number of input logical values for outputting logic 0)×(the number of input logical values for outputting logic 1)×2 is necessary in each partial circuit.

A circuit shown in FIG. 1 is divided into partial circuits P01 and P02 shown in FIG. 2 by a process as described in detail below, and a logical relation between input and output in a partial Circuit P01 is indicated in 301 of FIG. 3 and a logical relation between input and output in a partial circuit P02 is indicated in 302 of FIG. 3, therefore, the number of input logical changes necessary for the partial circuit P01 is six sorts of 1×3×2 and the number of input logical changes necessary for the partial circuit P02 is thirty sorts of 3×5×2.

Accordingly, in a method of CB-Power, since the calculation of a power consumption is executed for a minute in each of input logical changes having six sorts for the partial circuit P01 and thirty sorts for the partial circuit P02, it takes thirty-six minutes.

That is, in a method of CB-Power, the time required for calculating a power consumption is longer than in a general method in the case of a logical gate.

However, in the case of a hundred kinds of partial circuits, if each one kind of a partial circuit is used twice in the whole circuit, it takes 2,400 minutes of 24×100 in a general method, however, it takes only 1,800 minutes of 36×100/2 in a method of CB-Power.

If each one kind of a partial circuit is used three times in the whole circuit, it takes 1,200 minutes, and if four times, it takes 900 minutes.

In a gate array library which is intended for a gate array in a mode wherein a logic element made on a thin film silicon on a substrate is connected with a wiring, since kinds of a logic element tends to be reduced and a size (width and height) of a transistor (strictly, a transistor as an element, however, it is referred to as merely 'a transistor' in this specification) used at the logic element tends to be made uniform in order to use the logic element efficiently, eventually, partial circuits having the same characteristic and constitution are frequently used at a plurality of logical gates. Consequently, in a method of CB-Power, the time required for calculating a power consumption characteristic can be reduced greatly.

SUMMARY OF THE INVENTON

As described above, a conventional method of CB-Power is a very efficient method in the case of using partial circuits having the same characteristic and constitution at a plurality of logical gates, such as a gate array library.

However, a cell-based library, wherein a logic element (cell) with a uniform size height) is disposed and wired, has a high degree of freedom and generally more lands of cells than a gate array library because of adopting a mode in which a logic element is not made on a silicon beforehand.

Eventually, partial circuits having the same characteristic and constitution are not frequently used at a plurality of logical gates. This results in decreasing the reduction effect of the time for calculating a power consumption by recycling a power consumption in a partial circuit for another logical gate having the same partial circuit as the above-mentioned partial circuit.

Meanwhile, it is necessary to calculate a power consumption regarding a logical value which does not propagate to an input wiring in a partial circuit at the second stage or more of a logical gate composed of two or more partial circuits because of presupposing the recycling of a power consumption in a partial circuit.

For instance, in a circuit shown in FIG. 1, although thirty sorts of input logical changes in a partial circuit P02 at the second stage are necessary for a method of CB-Power, only eight sorts of input logical changes in the partial circuit P02 occur in an actual logical gate as shown in 402 of FIG. 4.

Thus, since a power consumption in a partial circuit is measured without considering a circuit constitution of a logical gate in a method of CB-Power, an unnecessary power consumption is calculated in the case of not using partial circuits having the same characteristic and constitution at a plurality of logical gates.

Moreover, since a power consumption is determined by which path in a circuit network a current flows in, there is a case wherein a path which a current flows in is the same and a power consumption is equal even if an input change is different. For instance, in the case of giving input changes in a partial circuit of input numbers 7 and 8 in a partial circuit shown in 402 of FIG. 4 to a partial circuit P02, a current flows in the same current path and a power consumption is equalized like current paths of input numbers 7 and 8 in a partial circuit shown in 502 of FIG. 5.

Furthermore, even in the case of a different current path, if the number of transistors on each current path is equal and a direction of a current between an output wiring and a transistor is the same and a current characteristic of transistors in the same order on each current path is the same, a power consumption is sometimes equal since a current which flows in each current path is equal.

For instance, as regards a partial circuit P01, when a current characteristic of transistors TP11 and TP12 is the same, in the case of giving input changes in a partial circuit of input numbers 2 and 3 in a partial circuit shown in 401 of FIG. 4, a current flows in current paths of input numbers 2 and 3 in a partial circuit shown in 501 of FIG. 5, and then a quantity of the current is equal and a power consumption is equal Generally, a current characteristic of transistors in parallel like this is often the same. A purpose of estimating a power consumption in a circuit is mainly a determination of a package and a power supply, or a choice of a circuit architecture, and a higher speed in producing a library is thought more of than a strict solution. This is like that an approximate value of weight, measurements and power consumption is generally satisfactory for a stage of planning and designing a ship and a building, and it is uneconomical in terms of expense and time to obtain a strict value according to a detailed design.

However, in a method of CB-Power, a calculation of a power consumption for each input change in a partial circuit is executed even in such a case of an equal power consumption.

Other techniques for producing a power consumption library of such a gate level are still unsatisfactory in various respects.

Consequently, the present invention aims to provide a technique for calculating a power consumption wherein it is possible to reduce the time required for calculating a power consumption at a logical gate even in the case of not using partial circuits having the same characteristic and constitution at a plurality of logical gates, such as a cell-based library.

Likewise, it aims to provide a technique for measuring a power consumption at a speed required for each stage and with a sufficient precision for each stage according to a stage of designing estimation, initial planning, details and production.

Likewise, it aims to provide a technique for measuring a power consumption rapidly instead of unnecessary measuring.

Likewise, it aims to provide a technique wherein it is possible to reduce the time required for measuring a power consumption at a logical gate even in the case of not using partial circuits having the same characteristic and constitution at a plurality of logical gates, such as a cell-based library.

Likewise, it aims to provide a technique wherein it is possible to reduce an input logical change for measuring a power consumption.

Likewise, it aims to provide a technique wherein it is possible to detect a path of a pass current at a high speed without sending a current in a circuit actually.

Moreover, it aims to provide a technique wherein it is possible to detect a path of a pass current at a high speed without sending a current in a circuit actually, and reduce an input logical change for measuring a power consumption.

Furthermore, it aims to provide a technique wherein it is possible to reduce the time required for measuring a power consumption, and reduce an input logical change for measuring a power consumption.

The present invention has been intended to solve the above-mentioned problems or achieve the above-mentioned purposes, and reduces the time required for calculating a power consumption characteristic at a logical gate without unnecessary measuring by considering an identity and a similarity of a partial circuit constitution at a logical gate, and additionally, an identity and a similarity of a current path, a current characteristic and a transistor. In addition, it further reduces the time required for calculating a power consumption characterstic at a logical gate by judging an identity and a similarity of a partial circuit constitution on a proper standard. More specifically, it is composed as described below.

The invention according to Claim 1 comprises a means for memorizing a circuit network, comprising such storage media as an IC memory, a hard disc and a photomagnetic disc for memorizing a circuit network having a transistor and an input wiring and an output wiring and a power supply line and an earth line; a means for memorizing a circuit input, comprising an IC memory and the like for memorizing a Circuit input, which is a logical change given to the input wiring in the above-mentioned circuit network, through inputting by an operator (including an automatic inputting by a program);

- a means for making and memorizing a partial circuit, comprising a CPU with a memory and the like for making and memorizing a partial circuit, into which a connection between a gate terminal and a terminal except a gate terminal is separated, through a predetermined procedure under a program while holding a connection between gate terminals and a connection between terminals except a gate terminal at the transistor (an element) composing the circuit network memorized by the above-mentioned means for memorizing a circuit network;
- a means for making and memorizing a partial circuit connection, which is a connection between the above-mentioned partial circuits, while considering a function and an adjustment of the means for making and memorizing a partial circuit;
- a means for calculating and memorizing an input/output relation of a partial circuit, which is a correspondence of a logical value in a partial circuit input wiring for transmitting the logical value from outside to the partial circuit to a logical value in a partial circuit output wiring for transmitting the logical value from the partial circuit to outside, in each partial circuit under a program, based on a memory in the means for making and memorizing a partial circuit;
- a means for calculating and memorizing a relation of a circuit input to a partial circuit input, which is a correspondence of the logical change given to the input wiring in the circuit network to an input change in each partial circuit, based on a memory in the means for memorizing a circuit input and a memory in the means for making and memorizing a partial circuit connection and a memory in the means for calculating and memorizing an input/output relation of a partial circuit;
- a means for calculating and memorizing a relation of a partial circuit input to a power consumption, which is a correspondence of an input logical change column in the partial circuit to a power consumption in each input logical change, through a predetermined procedure, based on a memory in the means for making and memorizing a partial circuit and a memory in the means for calculating and. memorizing an input/output relation of a partial circuit; and
- a means for calculating and memorizing a circuit power consumption by regarding the sum of a power consumption at each partial circuit input corresponding to each circuit input as a power consumption in a circuit corresponding to each circuit input, based on a memory in the means for calculating and memorizing a relation of a circuit input to a partial circuit input and a memory in the means for calculating and memorizing a relation of a partial circuit input to a power consumption.

According to the above-mentioned constitution, a function as described below is executed.

The means for memorizing a circuit network memorizes a circuit network having at least a transistor and an input wiring and an output wiring in various tables showing various connections from an operator, a pointer list or a diagram.

The means for memorizing a circuit input memorizes a circuit input, which is a logical change of 1, 0 (high or low voltage) given to the input wiring in the circuit network, such as in a table showing a correspondence of the logical change in each input wiring or a table showing a combination of the logical change in each input wiring in the circuit network.

The means for making and memorizing a partial circuit makes and memorizes a part circuit, into which a connection between a gate terminal and a terminal except a gate terminal is separated, by eliminating the connection between a gate terminal and a terminal except a gate terminal referring to a pointer list while holding a connection between gate terminals and a connection between terminals except a gate terminal at the transistor composing the circuit network.

The means for making and memorizing a partial circuit connection makes and memorizes a partial circuit connection, which is a connection between the above-mentioned partial circuits, while considering a function and an adjustment of the means for making and memorizing a partial circuit, such as in a table showing a correspondence to a counterpart for connecting in each partial circuit or a corrected pointer list.

The means for calculating and memorizing an input/output relation of a partial circuit calculates and memorizes an input/output relation of a partial circuit, which is a correspondence of a logical value in a partial circuit input wiring for transmitting the logical value from outside the circuit network or another partial circuit on the upper stream side to the partial t to a logic value in a partial circuit output wiring for transmitting the logical value from the partial circuit to outside or the lower stream side, in each partial circuit, based on a memory in the means for making and memorizing a partial circuit, such as in a table.

The means for calculating and memorizing a relation of the circuit input to a partial circuit input calculates and memorizes a relation of the circuit input to a partial circuit input, which is a correspondence of the logical change given to the input wiring in the circuit network to an input change in each partial circuit, through a predetermined procedure of calculating sequentially from a partial circuit on the upper stream side, based on a memory in the means for memorizing a circuit input and a memory in the means for making and memorizing a partial circuit connection and a memory in the means for calculating and memorizing an input/output relation of a partial circuit. Accordingly, in this case, the partial circuit can be an input logical value in each partial circuit, however, in an actual circuit, a consumption of electric power is not calculated as regards an input logical value which can not be an input into the partial circuit because of the input and a partial circuit on the upper stream side of the partial circuit.

The means for calculating and memorizing a relation of the partial circuit input to a power consumption calculates and memorizes a relation of the partial circuit input to a power consumption, which is a correspondence of an input logical change column in the partial circuit to a power consumption in each input logical change, by referring to a library of various data under a program or accessing another formula, based on a memory in the means for making and memorizing a partial circuit and a memory in the means for calculating and memorizing an input/output relation of a partial circuit.

The means for calculating and memorizing a circuit power consumption calculates and memorizes a circuit power consumption at each circuit input by regarding the sum of a power consumption at each partial circuit input corresponding to each circuit input as a power consumption in a circuit corresponding to each circuit input, based on a memory in the means for calculating and memorizing a relation of a circuit input to a partial circuit input and a memory in the means for calculating and memorizing a relation of the partial circuit input to a power consumption.

The means for calculating and memorizing an input/output relation of a partial circuit in the invention according to Claim 2 comprises a minor means for making a priority order of a partial circuit along a flow of a current and a signal from an upper stream side to a lower stream side under a priority of a power and a signal on the upper stream side as regards a partial circuit memorized by the means for making and memorizing a partial circuit, based on a memory in the means for memorizing a circuit network and a memory in the means for making and memorizing a partial circuit connection; and a minor means for calculating and memorizing an input/output relation of a circuit except an imaginary part, which is a correspondence of an input logical value to an output logical value except calculating a logical value for outputting to outside as regards a combination of a logical value which is not actually input into each partial circuit in the priority order determined by the minor means for making a priority order of a partial circuit, sequentially in each partial chit, based on a circuit input memorized by the means for memorizing a circuit input.

According to the above-mentioned constitution, a function as described below is executed.

The minor means for making a priority order of a partial circuit in the means for calculating and memorizing an input/output relation of a partial circuit makes a priority order of a partial c t along a flow of a current and a signal from an upper stream side to a lower stream side under a priority of a power and a signal on the upper stream side as regards a partial circuit memorized by the means for making and memorizing a partial circuit, based on a memory in the means for memorizing a circuit network and a memory in the means for making and memorizing a partial circuit connection. Naturally, partial circuits having the same priority order sometimes occur.)

Likewise, the minor means for calculating and memorizing an input/output relation of a circuit except an imaginary part calculates and memorizes an input/output relation of a circuit except an imaginary part, which is a correspondence of an input logical value to an output logical value except calculating a logical value for outputting to outside (therefore, a combination is not excluded in the case of not knowing whether it is input or not) as regards a combination of a logic value which is not actually input into each partial circuit in the priority order determined by the minor means for making a priority order of a partial circuit, sequentially in each partial circuit, based on a circuit input memorized by the means for memorizing a circuit input.

The invention according to Claim 3 comprises a means for identifying a circuit which refers to a memory in the means for making and memorizing a partial circuit and a memory in the means for calculating and memorizing a relation of a circuit input to a partial circuit input before a function of the means for calculating and memorizing a relation of a partial circuit input to a power consumption; regards a partial circuit having the same constitution of a partial circuit and the same input change in a circuit input to a partial circuit as the same partial circuit; memorizes the partial circuit again in the means for making and memorizing a partial circuit and the means for calculating and memorizing a relation of a circuit input to a partial circuit input; and functions so that the means for calculating and memorizing a circuit power consumption reuses a calculation of the same circuit.

According to the abovementioned constitution, a function as described below is executed.

The means for identifying a circuit refers to a memory in the means for making and memorizing a partial circuit and a memory in the means for calculating and memorizing a relation of a circuit input to a partial circuit input before a function of the means for calculating and memorizing a relation of a partial circuit input to a power consumption; regards a partial circuit having the same constitution (the number of transistors and a connection) of a partial circuit and the same input change in a circuit input to a partial circuit as the same partial circuit in view of a power consumption; memorizes the partial circuit identically again in the means for making and memorizing a partial circuit and the means for calculating and memorizing a relation of a circuit input to a partial circuit input; and functions so that the means for calculating and memorizing a circuit power consumption reuses a calculation of the same circuit for an identified partial circuit.

Consequently, the means for calculating and memorizing a t power consumption adds an amount of (the number of identified partial circuits)×(a power consumption of one of the partial circuits) in calculating a power consumption of a plurality of identified partial circuits in the whole circuit network.

The means for calculating and memorizing a relation of a partial circuit input to a power consumption in the invention according to Claim 4 comprises a minor means for making and memorizing a current path (including not merely a wire and a signal line but also a transistor), which is a joined path of a path from a power supply wiring to a ground wiring having a transistor driven (not having a transistor not driven) by either of a logical value before a change and a logical value after a change of a partial circuit input in a partial circuit as well as a path from a power supply wiring to an output wiring or a path from an output wiring to a ground wiring having a transistor driven by a logical value after a change in a partial circuit, in each partial wart after referring to a memory in the means for making and memorizing a partial circuit and a memory in the means for calculating and memorizing an input/output relation of a partial circuit;

a minor means for making and memorizing a relation of a partial circuit input to a current path, which is a correspondence of a memory in the means for calculating and memorizing an input/output relation of a partial circuit to a current path made by the minor means for making and memorizing a current path, in each partial circuit; and a minor means for calculating and memorizing a relation of a partial circuit input to a power consumption by calculating a power consumption in each current path through a relation between a current and a voltage with the use of a current path memorized by the minor means for making and memorizing a relation of a partial circuit input to a current path.

According to the abovementioned constitution, a function as described below is executed.

The minor means for making and memorizing a current path makes and memorizes a current path, which is a joined path of a path from a power supply wiring to a ground wiring having a transistor driven by either of a logical value before a change and a logical value after a change of a partial circuit input in a partial circuit as well as a path from a power supply wiring to an output wiring or a path from an output wiring to a ground wiring having a transistor driven by a logical value after a change in a partial circuit, in each partial circuit by referring to a partial circuit memorized separately and memorizing a transistor on the current path and its order after referring to a memory in the means for making and memorizing a partial circuit and a memory in the means for calculating and memorizing an input/output relation of a partial circuit.

The minor means for making and memorizing a relation of a partial circuit input to a current path makes and memorizes a relation of a partial circuit input. to a current path, which is a correspondence of a memory in the means for calculating and memorizing an input/output relation of a partial circuit to a current path made by the minor means for making and memorizing a current path, in each partial circuit.

The minor means for calculating and memorizing a relation of a partial circuit input to a power consumption calculates and memorizes a relation of a partial circuit input to a power consumption by calculating a power consumption in each current path through a relation between a current and a voltage with the use of a current path memorized by the minor means for making and memorizing a relation of a partial circuit input to a current path.

Therefore, a calculation of a certain circuit among identified partial circuits is reused in calculating a power consumption of the same circuit.

The means for calculating and memorizing a relation of a partial circuit input to a power consumption in the invention according to Claim 5 comprises a minor means for identifying a partial circuit input which refers to a memory in the means for calculating and memorizing an input/output relation of a partial circuit and a memory in the minor means for making and memorizing a relation of a partial circuit input to a current path before a function of the minor means for calculating and memorizing a relation of a partial circuit input to a power consumption; regards a plurality of partial circuit inputs having the same current path as the same partial circuit input; memorizes the partial c t input again in the means for calculating and memorizing an input/output relation of a partial circuit and the minor means for making and memorizing a relation of a partial circuit input to a current path; and functions so that the minor means for calculating and memorizing a relation of a partial circuit input to a power consumption reuses a calculation of a power consumption of the same partial circuit input According to the above-mentioned constitution, a function as described below is executed.

The minor means for identifying a partial circuit input of the means for calculating and memorizing a relation of a partial circuit input to a power consumption refers to a memory in the means for calculating and memorizing an input/output relation of a partial circuit and a memory in the minor means for making and memorizing a relation of a partial circuit input to a current path before a function of the minor means for calculating and memorizing a relation of a partial circuit input to a power consumption; regards a plurality of partial circuit inputs having the same current path in a hardware constitution as the same partial circuit input in calculating a power consumption; memorizes the partial circuit input again in the means for calculating and memorizing an input/output relation of a partial circuit and the minor means for making and memorizing a relation of a partial circuit input to a current path; and functions so that the minor means for calculating and memorizing a relation of a partial circuit input to a power consumption reuses a calculation of a power consumption of the same partial circuit input for an identified partial circuit input.

The means for calculating and memorizing a relation of a partial circuit input to a power consumption in the invention according to Claim 6 comprises a minor means for identifying a current path which refers to a memory in the minor means for making and memorizing a current path or a memory in the minor means for making and memorizing a relation of a partial circuit input to a current path before a function of the minor means for calculating and memorizing a relation of a partial circuit input to a power consumption; regards a plurality of current paths having the same number of transistors composing the current path, the same direction of a current flowing between an output wiring and a transistor, and the same current characteristic (I-V characteristic) of all transistors on the path in the same order from a power supply terminal as the same current path; and memorizes the current path again in the minor means for making and memorizing a current path or the minor means for making and memorizing a relation of a partial circuit input to a current path.

According to the above-mentioned constitution, a function as described below is executed.

The minor means for identifying a current path of the means for calculating and memorizing a relation of a partial circuit input to a power consumption refers to a memory in the minor means for making and memorizing a current path or a memory in the minor means for making and memorizing a relation of a partial circuit input to a current path before a function of the minor means for calculating and memorizing a relation of a partial circuit input to a power consumption; regards a plurality of current paths having the same number of transistors composing the current path, the same direction of a current flowing between an output wiring and a transistor, and the same current characteristic (I-V characteristic) of all transistors on the path in the same order from a power supply terminal as the same current path; and memorizes the current path again in the minor means for making and memorizing a current path or the minor means for making and memorizing a relation of a partial circuit input to a current path. Later, a relation of a partial circuit input to a power consumption is calculated and a redundant calculation of the same current path is omitted.

The invention according to Claim 21 comprises a means for memorizing a partial circuit which memorizes a plurality of partial circuits having a transistor and an input wiring and an output wiring;

a means for memorizing a partial circuit input which is a logical change given to the input wiring in the partial circuit;

a means for calculating and memorizing an input/output relation of a partial circuit, which is a correspondence of a logical value from outside to the partial circuit to a logical value from the partial circuit to outside, while considering a characteristic of a transistor on the partial circuit, based on a memory in the means for memorizing a partial circuit and a memory in the means for memorizing a partial circuit input;

a means for making and memorizing a current path, which is a joined path of a path from a power supply wiring to a ground wiring having a transistor driven by either of a logical value before a change and a logical value after a change of a partial circuit input in a partial circuit as well as a path from a power supply wiring to an output wiring or a path from an output wing to a ground wiring having a transistor driven by a logical value after a change in a partial circuit, after referring to a memory in the means for memorizing a partial circuit and a memory in the means for calculating and memorizing an input/output relation of a partial circuit;

a means for making and memorizing a relation of a partial circuit input to a current path which is a correspondence of a memory in the means for calculating and memorizing an input/output relation of a partial circuit to a current path made by the means for calculating and memorizing a current path;

a means for identifying a partial circuit input which refers to a memory in the means for making and memorizing a relation of a partial circuit input to a current path before calculating a current path at each partial circuit input, regards a plurality of partial circuit inputs having the same current path as the same partial circuit input, and memorizes the partial circuit input again in the means for making and memorizing a relation of a partial circuit input to a current path; and a means for calculating a partial circuit power consumption in a current path at each partial circuit input after a function of the means for identifying a partial circuit input.

According to the above-mentioned constitution, a function as described below is executed.

The means for memorizing a partial circuit memorizes a plurality of partial circuits having a transistor and an input wiring and an output wiring in a pointer list, a figure or a table.

The means for memorizing a partial circuit input memorizes a partial circuit input which is a logical change given to the input wiring in the partial circuit by inputting and calculating.

The means for calculating and memorizing an input/output relation of a partial circuit calculates and memorizes an input/output relation of a partial circuit, which is a correspondence of a logical value from outside to the partial circuit to a logical value from the partial circuit to outside, based on a memory in the means for memorizing a partial circuit and a memory in the means for memorizing a partial circuit input.

The means for making and memorizing a current path makes and memorizes a current path, which is a joined path of a path from a power supply wiring to a ground wiring having a transistor driven (not including a transistor not driven) by either of a logical value before a change and a logical value after a change of a partial circuit input in a partial circuit as well as a path from a power supply wiring to an output wiring or a path from an output wiring to a ground wiring having a transistor driven by a logical value after a change in a partial circuit, after referring to a memory in the means for memorizing a partial circuit and a memory in the means for calculating and memorizing an input/output relation of a partial circuit.

The means for making and memorizing a relation of a partial circuit input to a current path makes and memorizes a relation of a partial circuit input to a current path which is a correspondence of a memory in the means for calculating and memorizing an input/output relation of a partial circuit to a current path made by the means for calculating and memorizing a current path.

The means for identifying a partial circuit input identifies a partial circuit input which refers to a memory in the means for making and memorizing a relation of a partial circuit input to a current path before calculating a current path at each partial circuit input, regards a plurality of partial circuit inputs having the same current path as the same partial circuit input, and memorizes the partial circuit input again in the means for making and memorizing a relation of a partial circuit input to a current path for the purpose of reusing a calculation of a power consumption of the same partial circuit input for an identified partial circuit input.

The means for calculating a partial circuit power consumption calculates a power consumption in a current path at each partial circuit input after a function of the means for identifying a partial circuit input.

The invention according to Claim 22 comprises a means for identifying a current path which functions so that the means for making and memorizing a relation of a partial circuit input to a current path regards a plurality of current paths having the same number of transistors composing the current path, the same direction of a current flowing between an output wiring and a transistor, and the same current characteristic of all transistors in the same order as the same current path, based on a memory in the means for making and memorizing a current path before a function of the means for identifying a partial circuit input.

According to the above-mentioned constitution, a function as described below is executed.

The means for identifying a current path functions so that the means for making and memorizing a relation of a partial circuit input to a current path regards a plurality of current paths having the same number of transistors composing the current path, the same direction of a current flowing between an output wiring and a transistor, and the same current characteristic of all transistors in the same order as the same current path, and memorizes the current path again for the purpose of reusing a calculation of a power consumption of the same partial circuit input for an identified partial circuit input, based on a memory in the means for making and memorizing a current path before a function of the means for identifying a partial circuit input.

In other invention, such various operations as an output and an input for correcting after an examination are executed by a coinputer or a man under a coinputer system storing various data and programs internally, and thereby the same function as the invention according to Claim 1 to 6, or 21, 22 is executed and the same effect is obtained.

BRIEF DESCRIPTION OF THE DRAWINGS

FIG. 3 is a view showing an input/output relation of a partial circuit shown in FIG. 2.

FIG. 4 is an example of data of a partial circuit input shown in FIG. 2.

FIG. 5 is a view showing a relation of a partial circuit input to a pass current path.

FIGS. 6(a–b) is a view showing a formal constitution (an appearance as a device and a rough constitution of a function) of a means of calculating a power consumption characteristic according to the present invention.

FIG. 10 is a view conceptually showing a state in which a partial circuit is memorized in a table.

FIGS. 11(a–b) is a view conceptually showing a state in which a connection and the contents of the connection between partial circuits are memorized in a table.

FIG. 12 is a view conceptually showing the contents of a library are memorized in a table.

FIG. 15 is an example of a circuit input of a circuit network shown in FIG. 1.

FIG. 20 is a view showing an example of a correspondence of an input change to an output change in a partial circuit shown in FIG. 2.

FIG. 21 is an example of data of a relation of a circuit input to a partial circuit input.

FIG. 23 is an example of data of a relation of an input change in a partial circuit to a power consumption.

FIG. 28 is an example of data of a relation of a circuit input to a partial circuit input after reducing.

FIG. 29 is an example of data of an input change in a partial circuit after reducing.

FIG. 30 is an example o data of a relation of a partial circuit input to a power consumption after reducing.

FIG. 31 is an example of data of a relation of a circuit input to a power consumption.

FIG. 33 is an example of data of an input change in a partial circuit after reducing.

FIG. 34 is an example of data of a relation of a circuit input to a partial circuit input after reducing.

FIG. 35 is an example of data of a relation of a partial circuit input to a power consumption after reducing.

DESCRIPION OF THE PREFERRED EMBODIMENTS

Figure 1:
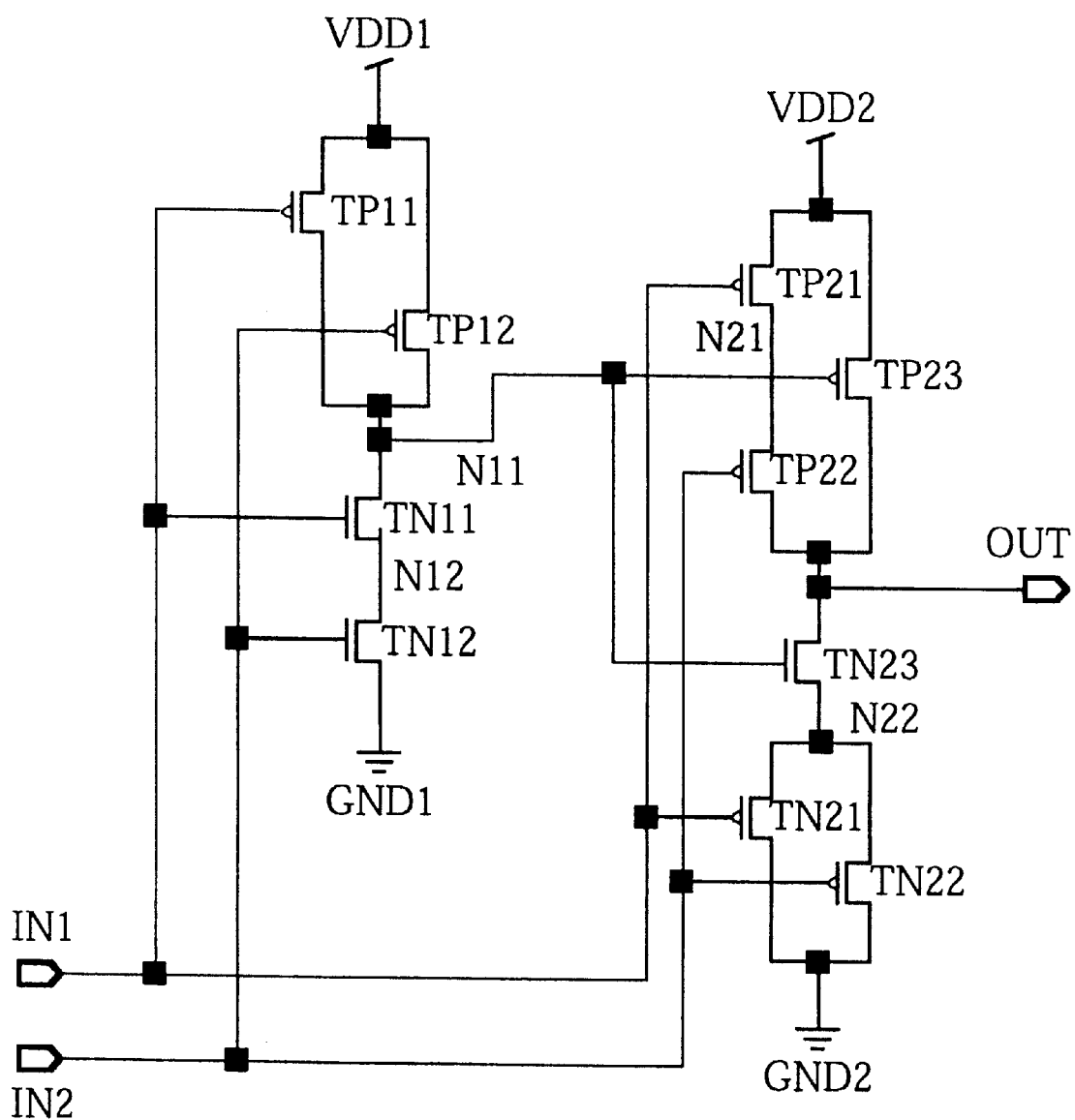
FIG. 1 is an example of data of a circuit network in Embodiments of the present invention.

The present invention is described below based on the preferred Embodiments.

(Embodiment in View of Hardware and Software of a Calculating Device)

A means of calculating a power consumption characteristic in the present invention is often constituted actually on a work station, and necessary calculation and memorization are executed at a CPU and a memory in a system. However, a constitution of hardware may be unclear in describing the system. Accordingly, a constitution of hardware is described in a system (a system selecting necessary parts from a work station) of a calculating device mainly used for calculating a power consumption characteristic in the present invention.

The constitution of hardware is shown in FIG. 6. In FIG. 6, (a) shows its appearance and 1 is a body storing a calculator, a liquid display unit and a hard disc storage unit internally. 2 is a keyboard and 3 is a mouse. 4 is a printer, 5 is a hard disc storing a program involved in each of the present invention and 6 is a hard disc storing a library (a dictionary, a data list) used for a calculation in the present invention. 7 is an external large-sized coinputer as compared with the calculator.

In addition to the above, the body is connected to an optical reader 8 and a CAD system 9 as required, and an output is executed also at the liquid display unit.

In the case of reading a circuit diagram optically, since a symbol of each circuit element is determined by Japan Industrial Standard, a circuit is provisionally recognized by a calculator based on the symbol and the result is confirmed by a man while displaying on a display unit.

A connection to a CAD system and a large-sized coinputer is executed under a variety of rules and communication regulations. However, these are not generally known, nevertheless, a technique which is easily achieved nowadays and thereby a detailed description of it is omitted.

(b) is a constitution view of (a).

In (b), 11 is a calculator unit, 12 is a communication unit, 23 is an input unit, 44 is an output unit, 55 is a program memory unit, 66 is a library memory unit, 77 is a circuit network memory unit, 88 is various memory units, 71 is an external large-sized coinputer, and 72 is an external data base. 8 is an optical reader and 9 is a CAD system.

Data which is read in from the hard disc 5, 6 shown in (a) is memorized in the program memory unit 55 and the library memory unit 66 which are provided in a calculator of the body 1.

Moreover, a circuit network to be calculated, which is input or read in from the keyboard 2 and the mouse 3 and an optical reader and a CAD system or a hard disc not shown in the figure, is memorized in the circuit network memory unit 77.

Furthermore, various necessary data with a progress of calculation, such as the contents of each partial circuit and a connection between partial circuits, are divided into one of the various memory units 88 by the calculator unit 11 and are memorized in the unit under a direction of a program of the program memory unit 55.

However, a program of dividing various data according to the contents, assigning an ID and memorizing in a predetermined address is a generally known technique, and thereby a description of it is omitted.

It is a generally known technique nowadays that a calculator calculates under a program and data which are read in from a hard disc. For instance, a domestic word processor can read in data stored in a hard disc and print in italics as well as function as a dictionary and check a misspelling in English sentences which is input. Still more, a personal coinputer and a calculator can do easily. (To take a type in printing for an instance, a print unit checks an existence of EL type by a print direction signal, and reads out the type if it exists and a regular type if not, and uses the type for printing) Consequently, a description of it is omitted.

Figure 7:
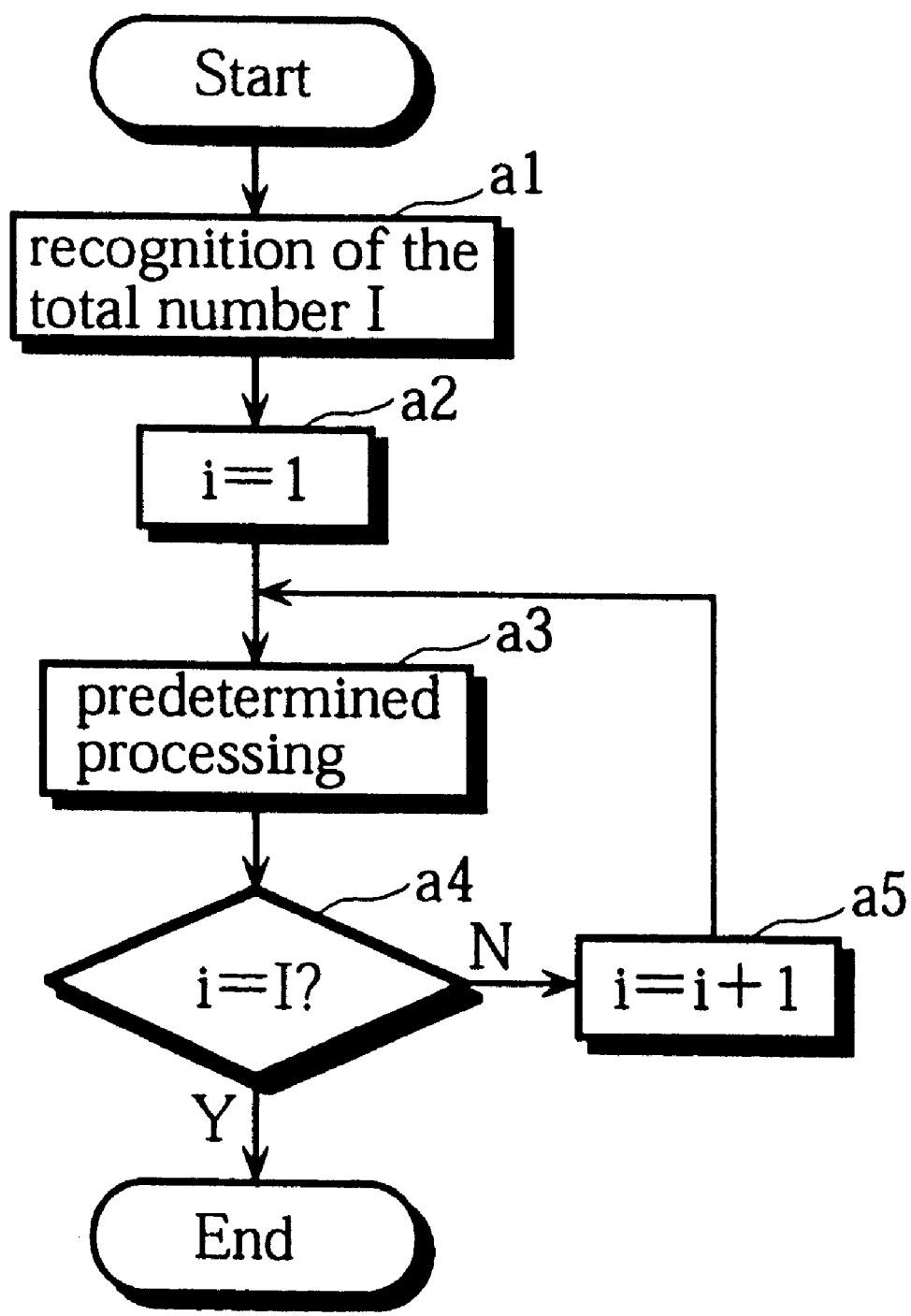
FIG. 7 is a view showing a principle procedure in repeating the same processing sequentially to a partial circuit in the present invention.

A principle procedure in various kinds of a repeat processing with the same contents or approximately the same in the present invention, such as a division into partial circuits and a calculation of a power consumption, is shown in FIG. 7.

As clarified in FIG. 7, the same predetermined processing (a step a3) from a prior processing (i=1, a step a2) through (i=I+1, steps a4, a5) to the last processing (i=I) is repeated in various kinds of a processing, such as a recognition processing of a circuit division and a calculation processing of a power consumption.

A recognition of the total number I (a step a1) is determined by a criterion of the number of input wiring and an end of division processing which are input by an operator if the contents of the processing in a step al are a division into partial circuits.

If the contents of the processing in a step al are a calculation processing of a power consumption in each partial circuit, a recognition of the total number I is determined by the number of partial circuits which are divided by a program of the program memory unit 55, or the processing of a program.

A priority order is determined along a flow of electricity and signals in a partial circuit and a current path. A part circuit and a current path which are connected to an input circuit from outside are prior to the flow.

These are described in detail later However, since a routine of repeating the same calculation is a generally known technique used widely for various kinds of a calculation processing, more description of it is omitted.

Figure 8:
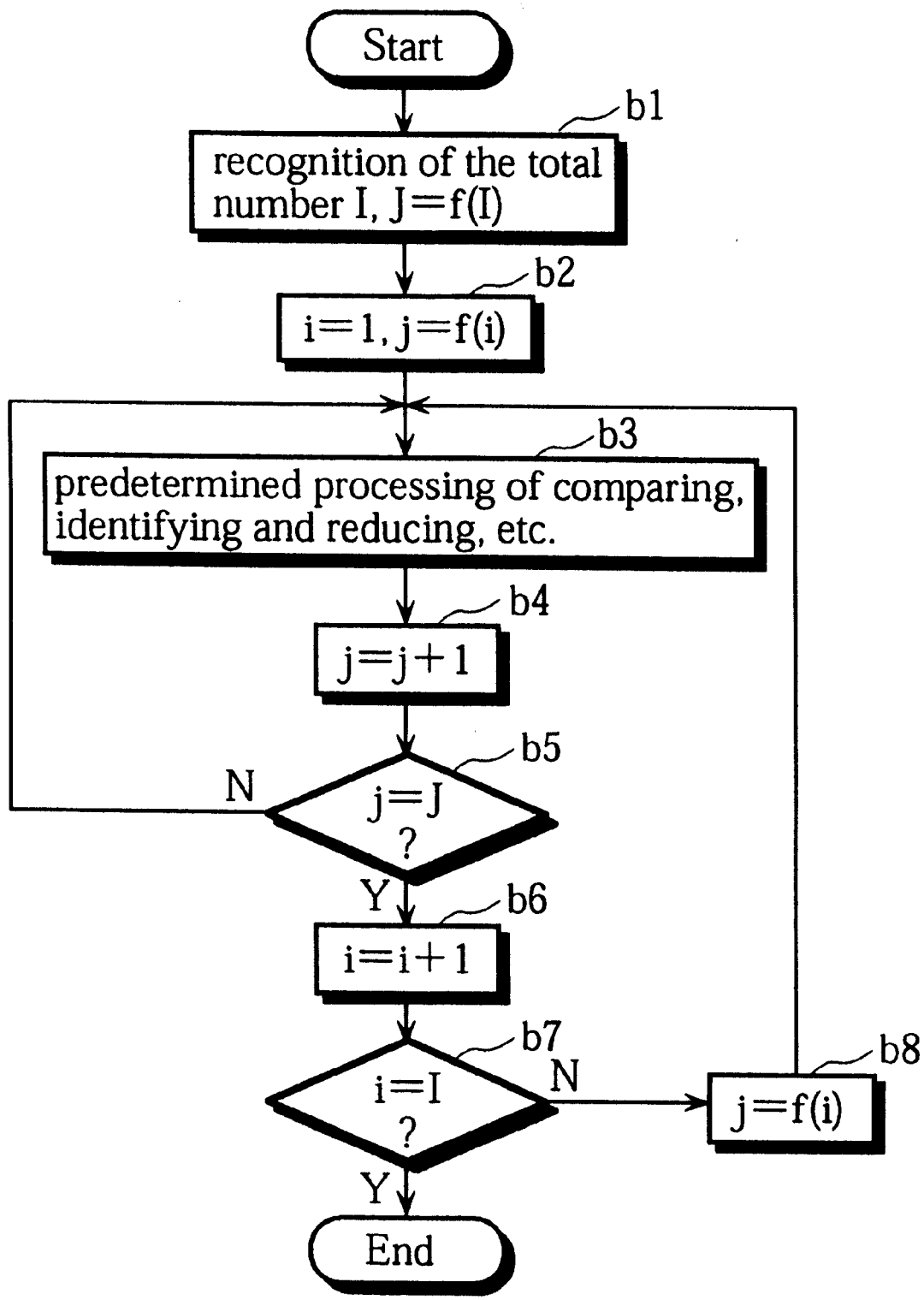
FIG. 8 is a flow chart showing a processing in determining the same or not sequentially in the present invention.

A procedure of a comparison processing covering the whole circuit network and each partial circuit in the present invention is shown in FIG. 8. This procedure is a division of the procedure in FIG. 7 into two stages.

In a recognition of the total number I, J (a step b1), I is the total number of partial circuits and J is a function of I (in principle, I=J) when the same partial circuit may exist in the whole circuit network.

When i=1, f(1)=2 is obtained in a determination of an initial valuej=f (i) (a step b2).

That is, first, a partial circuit 1 and 2 are judged the same or not (a step b3), and the partial circuit 1 and 3 to J are judged the same or not (steps b4, b5).

Next, through a processing ofi=i+1 (a step b6), and a partial circuit 2 and 3 (=f(i)=f(2), a step b8) are compared, and the partial circuit 2 and 4 to J (steps b4, b5) are judged the same or not (a step b3).

Thus, the same procedure is repeated until a partial circuit I−1 and a partial -circuit (steps b6, b7, b8).

In a recognition of the total number I, J (a step b1), I is the total number of partial circuits and J is the total number of current paths in each partial circuit in the case of comparing current paths in each partial circuit.

First, a current path 1 in a partial circuit 1 is taken out (a step b2), and the existence of the same current path is checked in the partial circuit 1, and checked in a partial circuit 2 to I (a step b3).

Next, a current path 2 in a partial circuit is taken out (a step b6), and the existence of the same current path is checked in the partial circuit 1, and under the same procedure, a current path J−1 and J in a partial circuit I are judged the same or not (steps b7, b8, b3, b4).

In every case, when a partial circuit or a current path is judged the same after comparing, a processing of identifying is executed in the middle of processing or after processing (a step b3). The same procedure is executed also in the case of a multitude of variables, not I, J. However, since this is a generally known procedure, more description of it is omitted.

Figure 9:
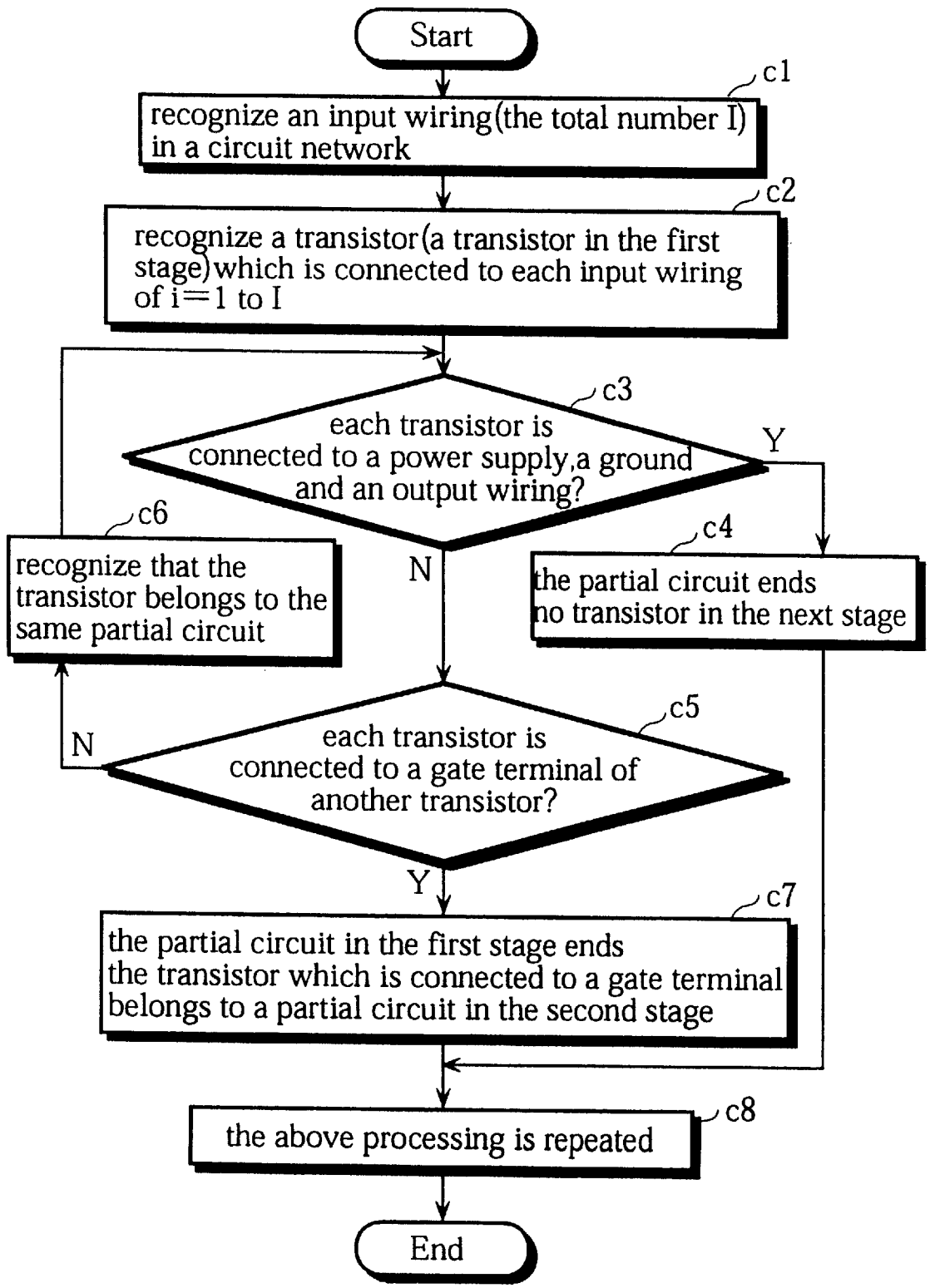
FIG. 9 is a flow chart showing a basic processing in making a partial circuit out of a circuit network.

A procedure of dividing a circuit network, which is input, into partial circuits is shown in FIG. 9.

(A step c1) An input wiring (the total number I) is confirmed in a circuit network which is input by an operator. Accordingly, in this case, I is input as a calculation condition by an operator.

(A step c2) A transistor directly connected to each input wiring of i=1 to I is confirmed. The transistor connected to each input wiring is made a transistor in the first stage. An output wiring of the transistor is followed.

(A step c3) Whether each transistor is connected to a power supply, a ground and an output wiring is judged.

(A step c4) If a transistor is connected to a power supply and the like, the partial circuit ends there without connecting to a partial circuit in the next stage. However, in the case of the partial circuit having a plurality of output terminals, the partial circuit may be connected to a partial circuit in the next stage through another output line.

(A step c5) Whether an output terminal of each transistor is connected to a gate terminal of another transistor is checked.

(A step c6) If an output terminal is not connected to a gate terminal of another transistor, the transistor is recognized to belong to the same partial circuit.

(A step c7) If an output terminal is connected to a gate terminal of another transistor, the transistor is recognized to belong to another partial circuit and a partial circuit in the second stage. (However, since the transistor is directly connected to another input wiring, actually the transistor may be a transistor in the first stage.)

(A step c8) The above processing is repeated until reaching a transistor connected to a power supply, a ground and an output wiring in the second and third stages and until all transistors belong to any one of partial circuits. (Accordingly, this step is an exception of a procedure shown in FIG. 7.)

The above is a principle, and actually various processing of adjustments and amendment are executed. This is similar to a procedure described later.

However, since this procedure of dividing is not so difficult a program, a more detailed description of it is omitted.

Figure 10:
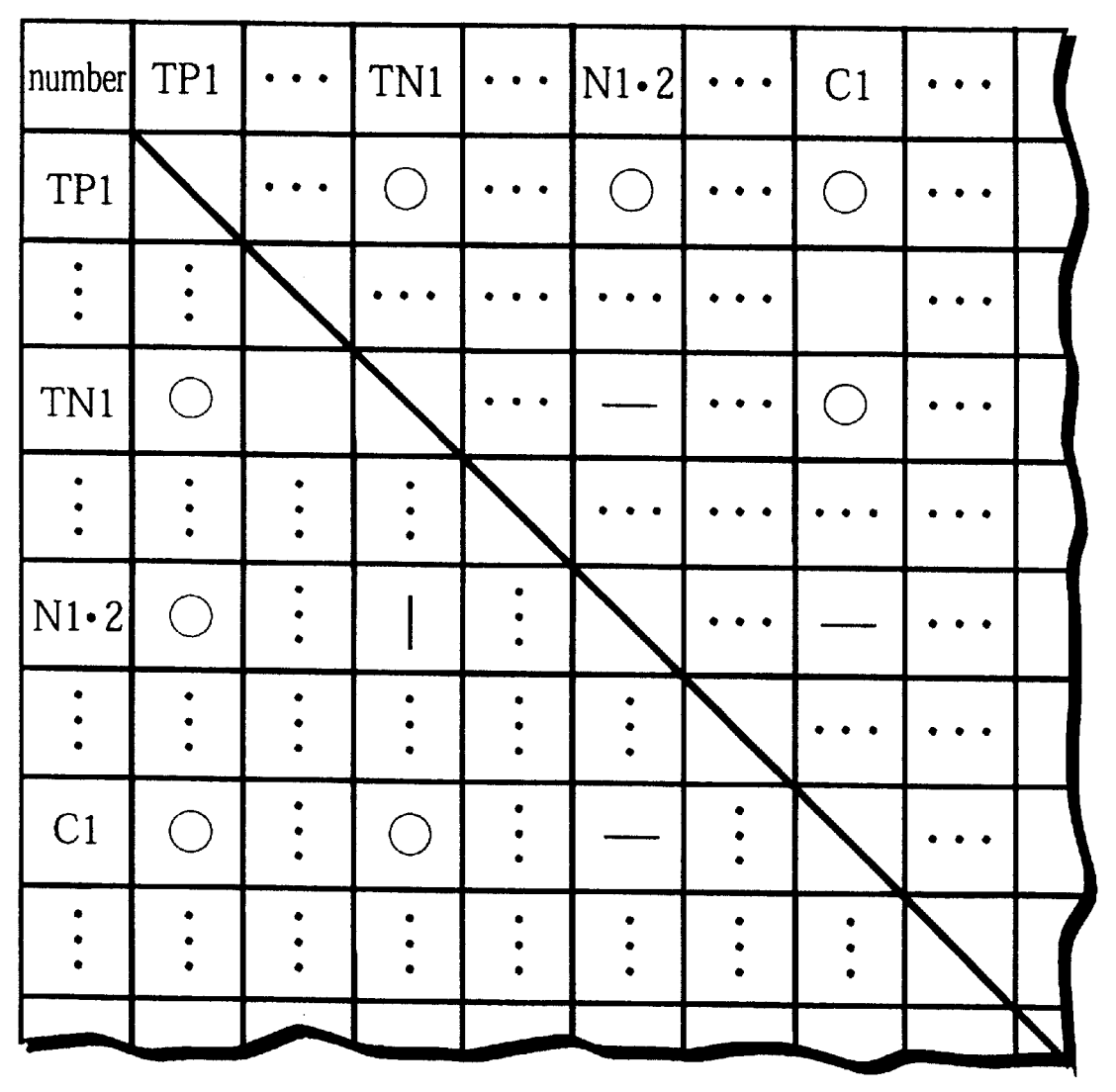

A partial circuit, which is memorized in a partial circuit memory unit inside the various memory units 88, is shown conceptually in FIG. 10. (A circuit network, which is memorized in the circuit network memory unit 77, is shown similarly.)

As shown in FIG. 10, N-type and P-type semiconductors (T), a connection line (N) and a capacity (C) belonging to a partial circuit are memorized in a table. A power supply and an earth not shown in the Fig. are combined with those connections. Those connections in the table are made according to the abovementioned steps c4, c5.

In the table of FIG. 10, a mark○ indicates a connection and a mark- indicates no connection. Consequently, it is understood that N-type semiconductor TP1 and P-type semiconductor TN1 are not connected. However, it is a generally known technique nowadays to memorize components of a partial circuit, such as in this table. Accordingly, a description of a procedure of making this table is omitted.

As regards the numbering from 1 to I of a partial circuit in the first stage or a priority order in processing, in principle, a partial circuit connected to an input circuit with a smaller number has a priority, or a partial circuit on the upper stream side has a priority.

Moreover, as regards the numbering of a partial circuit in the second stage or more, a partial circuit connected to a partial circuit with a smaller stage number has a priority. If a plurality of partial circuits are connected to a partial circuit with the same stage number, a partial circuit connected to a prior partial circuit has a priority.

However, as described above, although actually various processing of adjustments and detailed rules are necessary, more description of it is omitted since the contents are complicated and not so difficult This similar to a procedure described later.

A connection between partial circuits, which is memorized in a partial circuit connection memory unit, is shown conceptually in FIG. 11.

In FIG. 11, (a) shows the existence of a connection between partial circuits the number of which is I in total. In the table of FIG. 11, a mark- indicates no connection and a number indicates a kind of the contents of a connection, and 1•2 in a box in the second line from the top and the third column from the left indicates that a partial circuit 1 and a partial circuit 2 are connected. A connection between partial circuits is executed according to a processing of the above-mentioned steps c3 to 7.

A list of the contents of a connection, which is memorized in a connection contents memory unit inside a partial circuit connection memory unit, is shown conceptually in (b).

In the table of FIG. 11, N1•2, which is the contents of a connection between a partial circuit 1 and a partial circuit 2, indicates that 1 is on the upper stream side and 2 is on the lower stream side. N indicates the details of a connection line, more specifically, which output wiring in the partial circuit 1 is a gate terminal of which transistor in the partial circuit 2. Since the contents are complicated, they are memorized in a list which corresponds to the alphabets of A and N.

The connection between partial circuits is recognized by a coinputer in dividing a circuit. It is an easy technique nowadays that a coinputer makes various lists sequentially under a program based on the recognized connection between partial circuits. Consequently, a description of the contents in this program is omitted.

A procedure of making a relation of a partial circuit input to a current path is described below.

Such input/output circuits as a gate input terminal into a semiconductor, an input circuit from outside a circuit network, a power supply and a ground line, an input into a gate terminal of a semiconductor in a partial circuit on the lower stream side are confirmed at each partial circuit.

Later, a table showing a logical value of an output circuit is made in the case of giving logical values, such as open or close, to each input circuit. As a result, a table showing the correspondence of logical values of an input circuit and an output circuit is made. The contents of the table are described in Embodiments by taking a specific circuit network for an instance.

A rough procedure is as follows:
(1) taking out a partial circuit to be evaluated;
(2) taking out a combination list of each input logical value from an output circuit of a prior partial circuit, such as outside or on the upper stream side, to the above-mentioned partial circuit, namely, an input circuit into the above-mentioned partial circuit;
(3) confirming a power supply and a ground line in the above-mentioned partial circuit;
(4) checking whether electricity flows in a power supply, a ground line and a semiconductor connected to them at each combination of each input logical value from each input circuit; (This is executed basically under a procedure shown in FIGS. 7 and 8.)

Then, whether electricity flows in each semiconductor is judged by an input log value into the gate terminal and a type of the semiconductor.

When each semiconductor is connected to an output circuit and a gate terminal of another semiconductor, an area beyond the connection is not checked since the area belong to another partial circuit on the lower stream side.
(5) making a list of a semiconductor in which electricity flows at each combination of each input logical value into each input circuit;
(6) recognizing all current paths in the abovementioned partial circuit based on the above-mentioned (5);
(7) making a combination list of each output logical value of an output circuit to a partial circuit, such as outside or on the lower stream side, at each combination of each input logical value together with the above-mentioned (5) and (6); and (This also is executed basically under a procedure shown in FIGS. 7 and 8.)

A processing of partial circuit on the lower stream side is executed, and this processing is executed until the last partial circuit. Accordingly, this is executed under a procedure shown in FIG. 7.
(8) accessing a library (a dictionary, a data list) and reading out a resistance value and a capacity value of the above-mentioned semiconductor, and executing the calculation of a power consumption and the last confirmation of a current path in each partial circuit and each current path sequentially from a prior partial circuit.

However, a program necessary for these processing is an easy technique nowadays. Consequently, a description of the program for these processing is omitted.

A library is described below.

FIG. 12 is a table conceptually showing the contents of the library memory unit 66. The table shows resistance and capacity necessary for calculating an electric power which is consumed by N-type and P-type transistor and condenser under various conditions 1 and 2 determined by a steady state and a moment of activation. The first line of the table indicates that the first type of a P-type transistor has a resistance value of 1Ω under a condition 1 and 2Ω under a condition 2.

These data are used while referring to the contents corresponding to each condition in calculating a power consumption.

More specifically, a power consumption is a switching current which flows into or out of a wiring capacity when a transistor turns on/off, and a pass current which flows between a power and a ground terminal through a transistor at the moment of a change of a transistor. A current between a power and a ground terminal is estimated by using such a circuit simulator as SPICE and a power consumption is calculated by multiplying a voltage, and then resistance and capacity according to each condition are read out at each transistor and its type.

Figure 13:
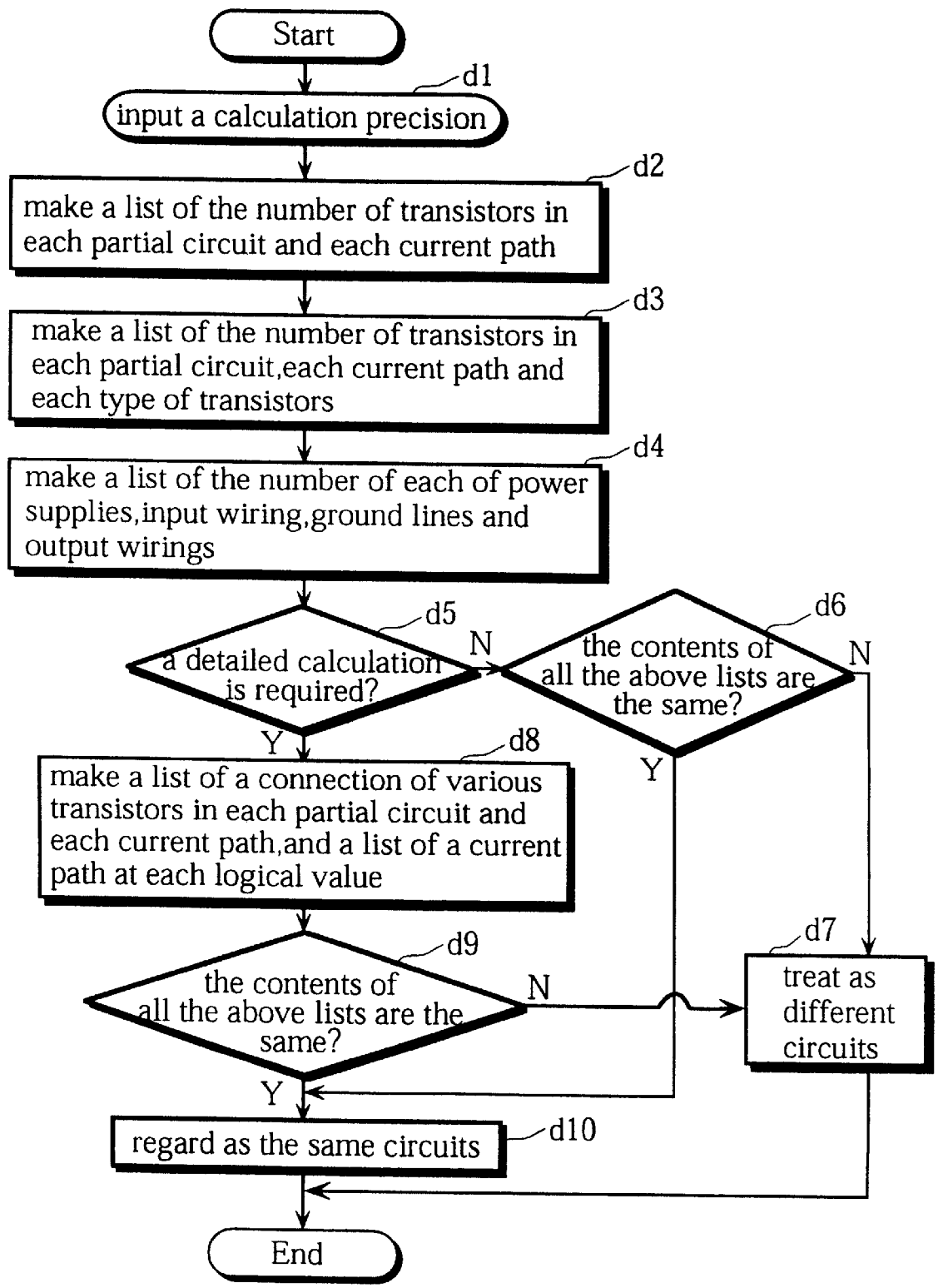
FIG. 13 is a view showing a procedure in judging an identity of each partial circuit according to a calculation precision required.

A procedure in judging an identity between partial aunts according to a calculation precision is described while referring to FIG. 13.

(A step d1) A calculation precision of an approximate calculation or a detailed calculation to some extent is input by a user.

(A step d2) A list of the number of transistors composing a partial circuit and a current path is made in each partial circuit and each current path.

(A step d3) A list of the number of transistors is made in each type of transistors.

(A step d4) A list of the number of each of power supplies, output wirings and ground lines is made.

(A step d5) Whether a detailed calculation is required is judged.

(A step d6) If an approximate calculation, whether the contents of all lists in the above stages are the same is judged.

(A step d7) If not the same, two compared partial circuits are treated as different circuits.

(A step d8) A list of a connection of various transistors is made in each partial circuit and each current path, and a list of a current path is made at each logical value.

(A step d9) If the contents of all lists are the same, two compared partial circuits are regarded as the same circuits.

(A step d10) if the contents of all lists are the same, two compared partial circuits are treated as the same circuits.

(A step d11) If any one of the lists is not the same as another, two compared partial circuits are treated as different circuits.

A judgment of an identity of a current path according to a calculation precision required is executing by approximately the same procedure.

In the above stages, a calculation precision has two steps in both a partial circuit and a current path, and it may have more steps which are divided closely.

The contents of identifying a partial circuit and a current path in calculating a power consumption characteristic are described.

It is assumed that a partial circuit i and a partial circuit j (i<j) are the same. A function of 'reading a value of a partial circuit i in a partial circuit j' is memorized in a memory of a power consumption characteristic in each partial circuit.

In calculating a power consumption, a value of a partial circuit i is read out and added instead of calculating and adding a value through a partial circuit j.

This is similar to the case of a current path.

The state of a logical value and a power consumption corresponding to an output circuit are output in a table showing a correspondence in each state of a logical value of each input circuit.

The above is an example of Embodiments in the present invention, other means and methods may be adopted.

For instance, in producing a partial circuit, elements (terminals) A and B are connected at an end Y, and the contents of the end Y are memorized in a pointer list. A judgment of an identity of the elements A and B is executed by referring to the data of the pointer list of the end Y connecting both of them and eliminating a connection between a gate terminal and a terminal except a gate terminal.

(Embodiment in View of a Treatment of a Specific Circuit)

The present invention is described below based on Embodiments for a simple circuit.

(Embodiment 1)

Figure 14:
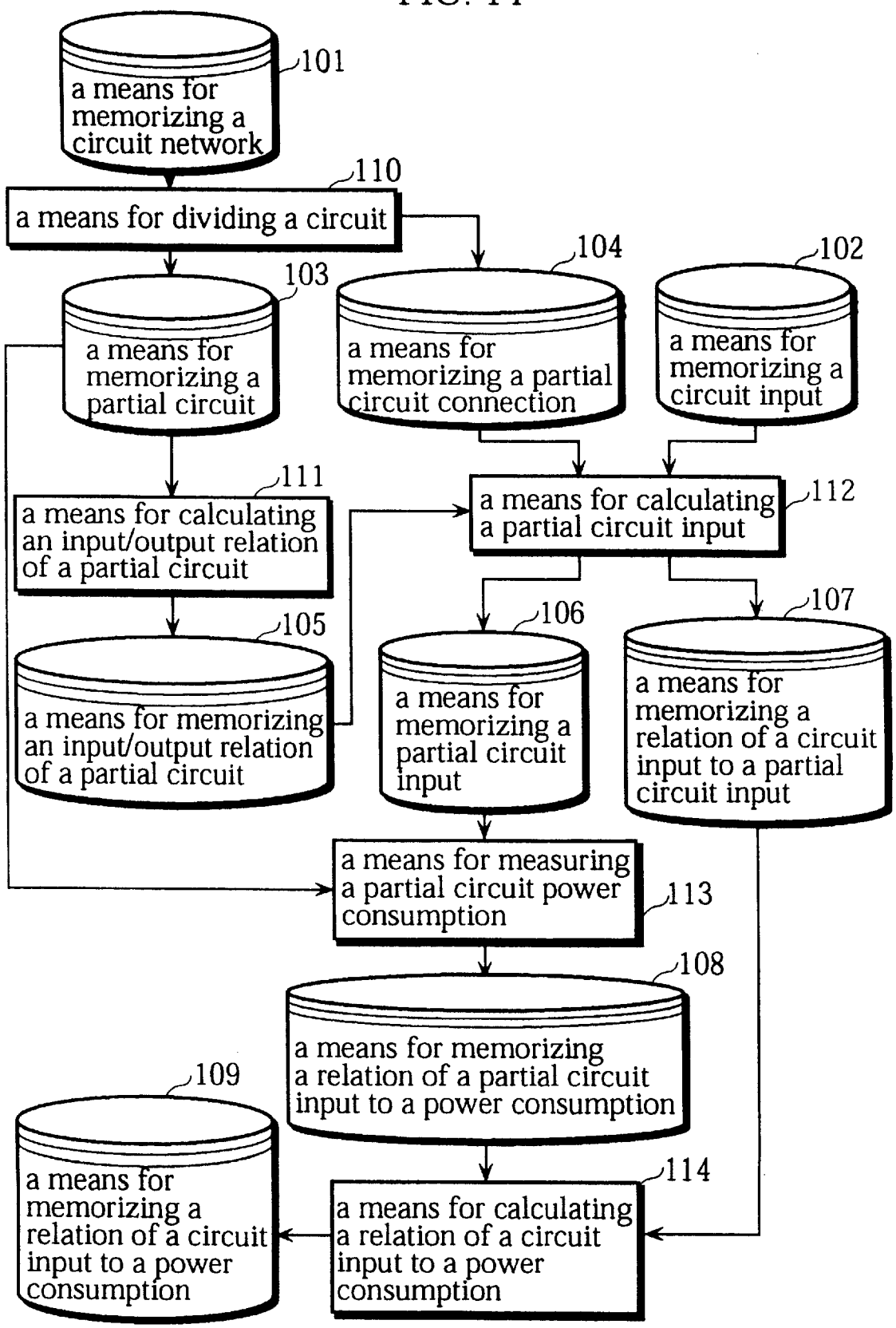
FIG. 14 is a constitution view of a means of calculating a power consumption characterstic in Embodiment 1 of the present invention.

FIG. 14 is a constitution view of a device of measuring a power consumption characteristic in Embodiment 1 of the present invention.

The device of measuring a power consumption characteristic comprises a means for memorizing a circuit network 101, a means for memorizing a circuit input 102, a means for memorizing a partial circuit 103, a means for memorizing a partial circuit connection 104, a means for memorizing an input/output relation of a partial circuit 105, a means for memorizing a partial circuit input 106, a means for memorizing a relation of a circuit input to a partial circuit input 107, a means for memorizing a relation of a partial circuit input to a power consumption 108, a means for memorizing a relation of a circuit input to a power consumption 109, a means for dividing a circuit 110, a means for calculating an input/output relation of a partial circuit 111, a means for calculating a partial circuit input 112, a means for measuring a partial circuit power consumption 113, and a means for calculating a relation of a circuit input to a power consumption 114.

A function and an effect of each means are described below.

In the means for memorizing a circuit network 101, a circuit network, in which a power consumption characteristic is calculated, shown visually in FIG. 1 is memorized beforehand in a various tables by a separate input.

The circuit network shown in FIG. 1 is composed of input wirings IN1 and IN2, an output wiring OUT, P-type transistors TP11, TlP12, TP21, TP22 and TP23, N-type transistors TN11, TN12, TN21, TN22 and TN23, power supply wirings VDD1 and VDD2, ground wirings GND1 and GND2, wirings between transistors N11, N12, N21 and N22.

In the means for memorizing a circuit input 102, a circuit input table shown in FIG. 15 is memorized as a part of a circuit network.

The circuit input table is made by a calculating unit (not shown in Figs.) of the device based on an input wiring input separately and a change of a logical value in each input wiring, and is composed of a list showing a correspondence of more than one logical change 1501 having an input logical value before a change and an input logical value after a change in a circuit input wiring, and a circuit input number is given to each logical change for distinguishing each logical change.

Figure 16:
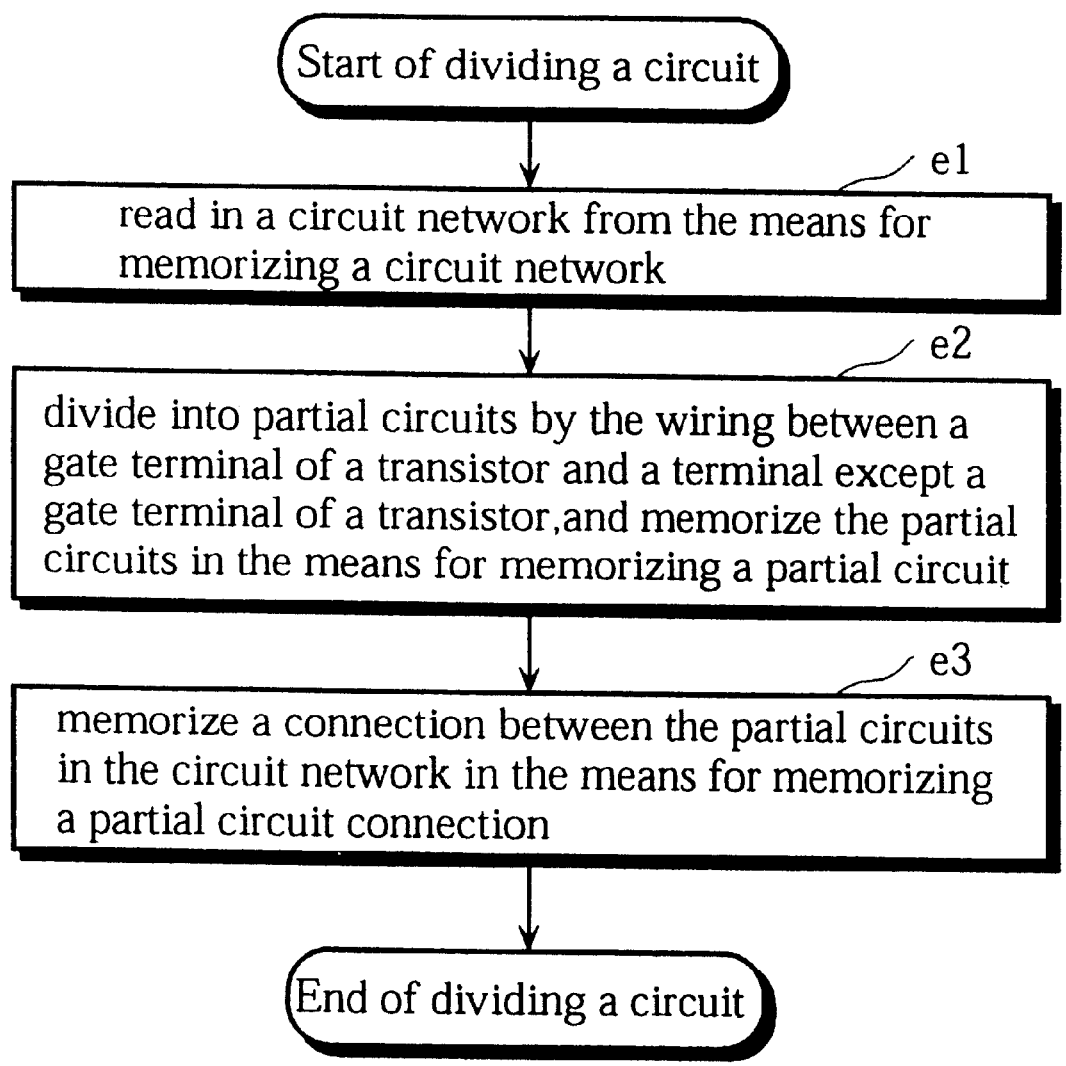
FIG. 16 is a view showing a procedure in dividing a circuit.

The means for dividing a circuit 110 executes functions shown in FIG. 16, which are similar to a description of FIG. 8. That is:

(A step e1) A circuit network shown in FIG. 1 is read in from the means for memorizing a circuit network 101.

Figure 2:
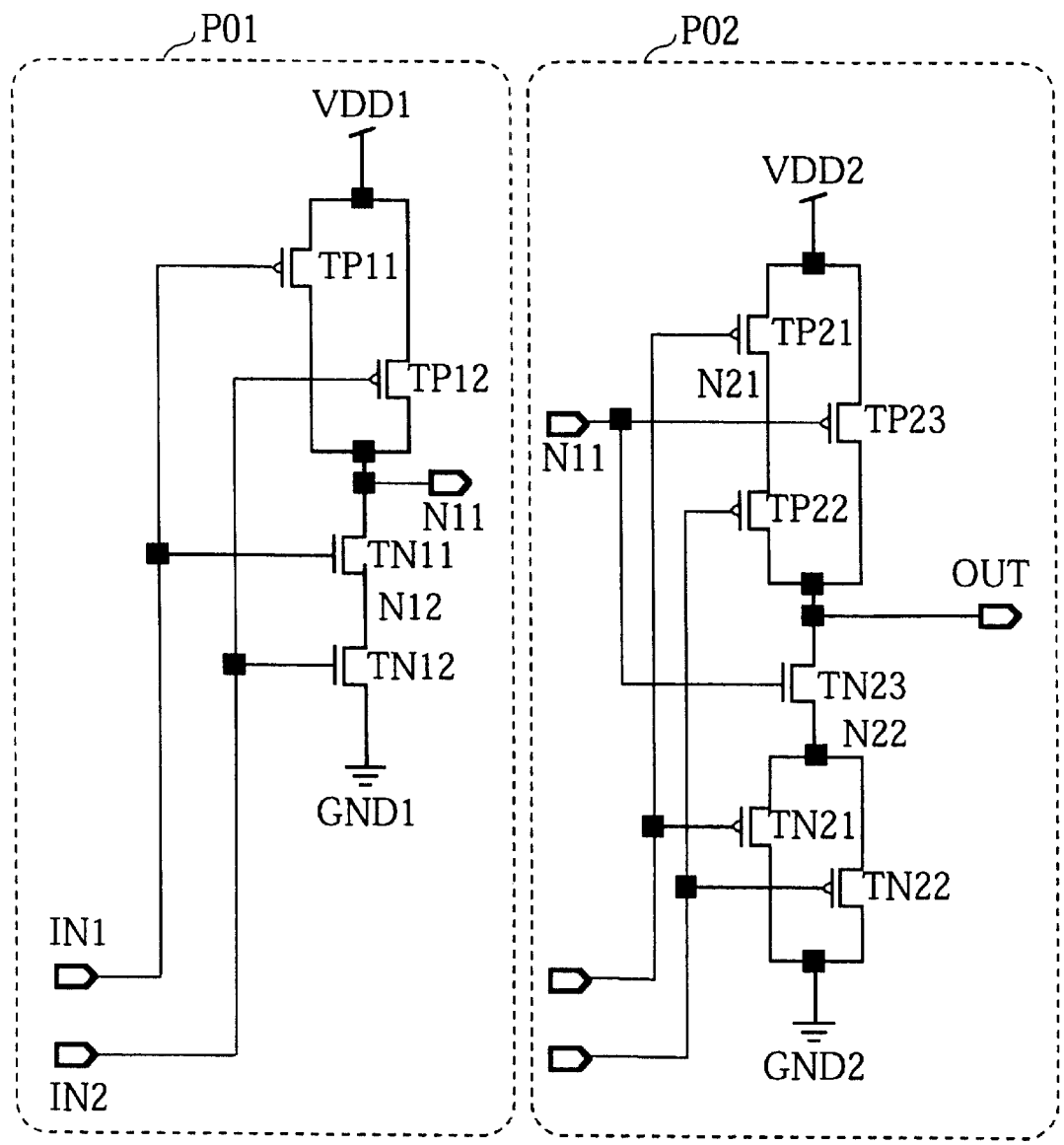
FIG. 2 is a view of a partial circuit which is made by dividing a t network shown in FIG. 1 in a procedure shown in FIG. 16.

(A step e2) The circuit network is divided into partial circuits (P01 and P02) by the wiring (N11) between a gate terminal of a transistor (TP23 and TN 23) and a terminal (a drain terminal of TP12 and a source terminal of TN11) except a gate terminal of a transistor, and the partial circuits are memorized in a form visually shown in FIG. 2 in the means for memorizing a partial circuit 103.

Figure 17:
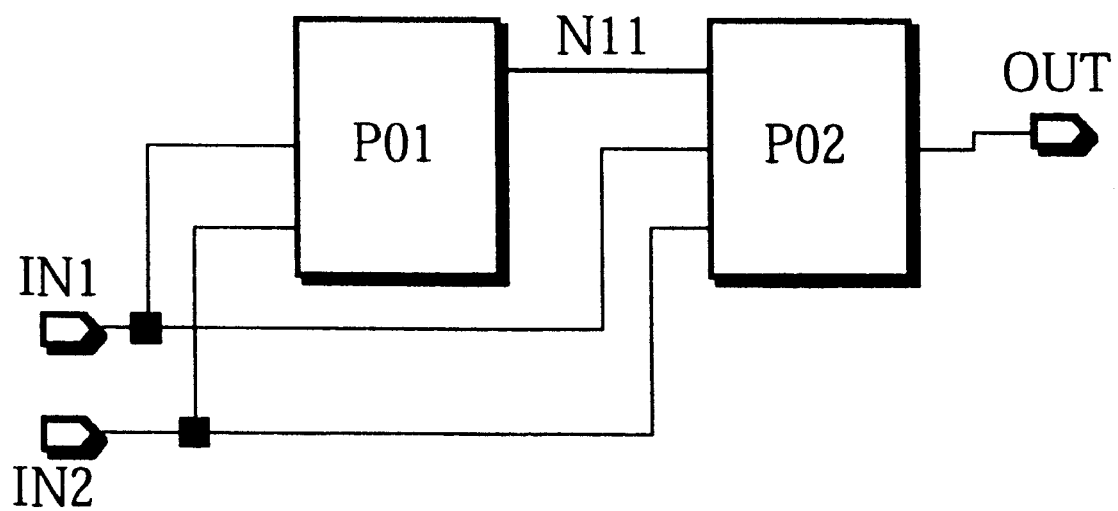
FIG. 17 is a view showing a connection of a partial circuit shown in FIG. 2.

(A step e3) A connection between the partial circuits (P01 and P02) shown in FIG. 2 in the circuit network shown in FIG. 1 is memorized in a form visually shown in FIG. 17 in the means for memorizig a partial arcuit connection 104.

In the partial circuits (P01 and P02) shown in FIG. 2, each wiring (IN1 and IN2 for the partial circuit P01; IN1, IN2 and N11 for the partial circuit P02) for transmitting a logical value from outside each of the partial circuits is hereinafter referred to as a partial circuit input wiring.

Each wiring (N11 for the partial circuit P01; OUT for the partial circuit P02) for transmitting a logical value from inside the partial circuits to outside the partial circuits is hereinafter referred to as a partial circuit output wiring.

Figure 18:
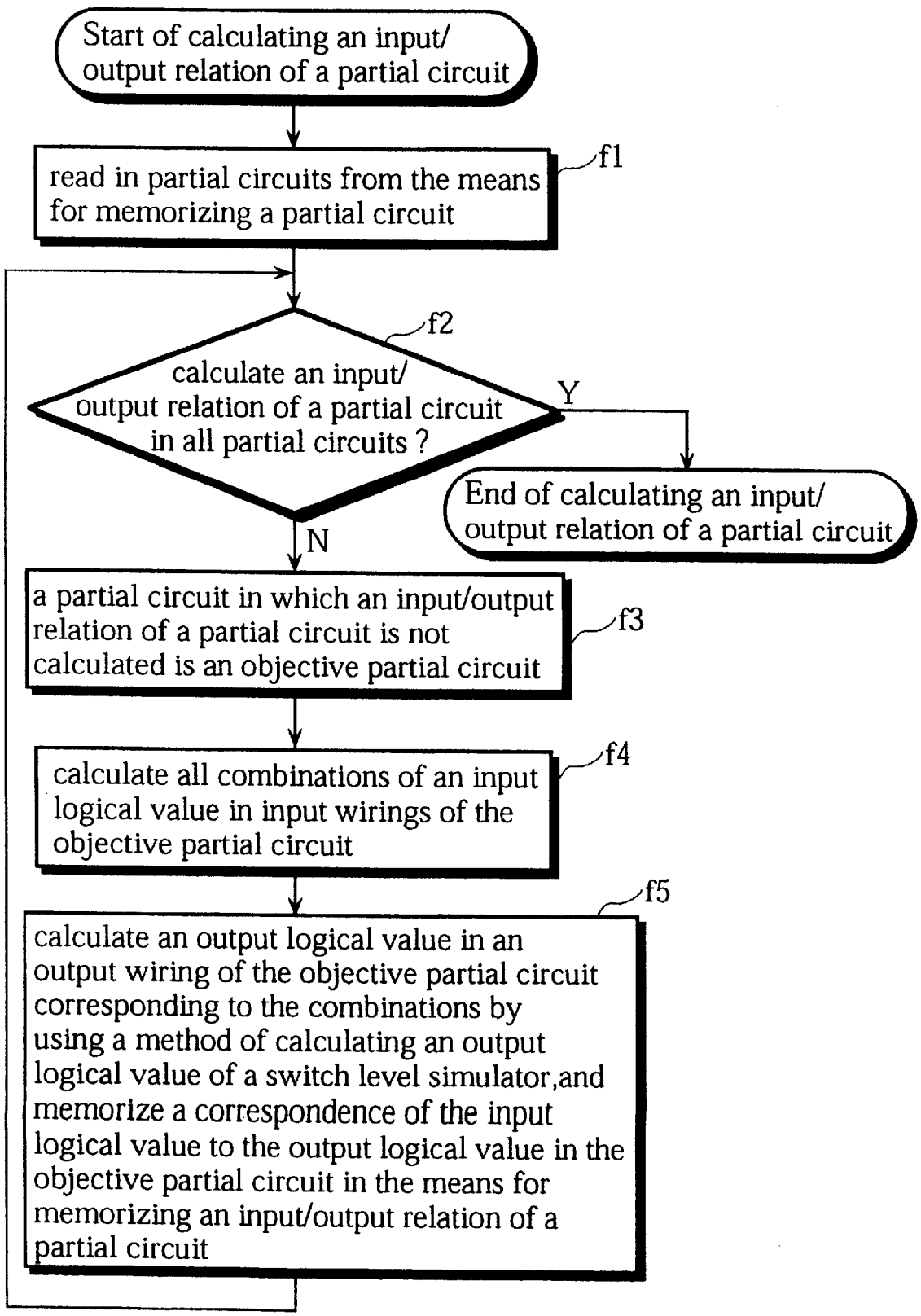
FIG. 18 is a view showing a procedure in calculating an input/output relation of a partial circuit shown in FIG. 2.

The means for calculating an input/output relation of a partial circuit 111 executes functions shown in FIG. 18. That is:

(A step f1) Partial circuits P01 and P02 visually shown in FIG. 2 are read in a various tables from the means for memorizing a partial circuit 103.

(A step f2) Whether an input/output relation of a partial circuit is calculated in all partial circuits P01 and P02 is checked, and if not, go to a step f3. Since naturally an input/output relation of a partial circuit is not calculated at first, go to a step f3.

The contents of steps below are essentially the same as the above-mentioned contents shown in FIG. 7.

(A step f3) The first partial circuit P01 in which an input/output relation of a partial circuit is not calculated is an objective partial circuit.

(A step f4) All combinations of an input logical value in the input wirings IN1 and IN2 of the partial circuit P01 are calculated in a form shown at 303 of FIG. 3.

(A step f5) An output logical value in the output wiring N11 of the partial circuit P01, shown at 305 of FIG. 3, corresponding to the combinations shown at 303 of FIG. 3 is calculated by using a method of calculating an output logical value of a switch level simulator, and a correspondence of the input logical value to the output logical value in the partial cat P01 is memorized in a form shown at 301 of FIG. 3 in the means for memorizing an input/output relation of a partial circuit 105.

A method of calculating an output logical value of a switch level simulator is a method wherein a transistor is treated as a switch which is driven or not by a logical value of a gate terminal since P-type transistor is driven (a current flows between a drain terminal and a source terminal) when a logical value of a net connecting to a gate terminal is 0 and is not driven when 1 as well as N-type transistor is driven when a logical value of a net connecting to a gate terminal is 1 and is not driven when 0, and an output logical value is calculated by using a logical value 1 of an output wiring when all transistors on any one of paths from a power supply wiring to a partial circuit output wiring are driven as well as a logical value 0 of an output wiring when all transistors on any one of paths from a ground wiring to a partial circuit output wiring are driven. This method is used in a general switch level simulator.

(A step f2) Whether an input/output relation of a partial circuit is calculated in all partial circuits P01 and P02 is checked, and since an input/output relation of the partial circuit P02 is not calculated, go to a step f3.

(A step f3) The partial circuit P02 in which an input/output relation of a partial circuit is not calculated is an objective partial circuit.

(A step f4) All combinations of an input logical value in the input wirings IN1, IN2 and N11 of the partial circuit P02 are calculated in a form shown at 304 of FIG. 3.

Since N11 is originally determined by IN1 and IN2, N11 can not have the values of 1, 0 independently of these changes of IN1 and IN2. In the case of actual complicated circuit network, it is assumed that N11 can have the values independently since it is unclear that N11 can not have.

(A step f5) An output logical value in the output wiring OUT of the partial circuit P02, shown at 306 of FIG. 3, corresponding to the combinations shown at 304 of FIG. 3 is calculated by using a method of calculating an output logical value of a switch level simulator, and a correspondence of the input logical value to the output logical value in the partial circuit P02 is memorized in a form shown at 302 of FIG. 3 in the means for memorizing an input/output relation of a partial circuit 105. (A step f2) Whether an input/output relation of a partial circuit is calculated in all partial circuits P01 and P02 is checked, and since an input/output relation of the partial circuits P01 and P02 is calculated, calculating an input/output relation of a partial circuit 111 is completed.

Figure 19:
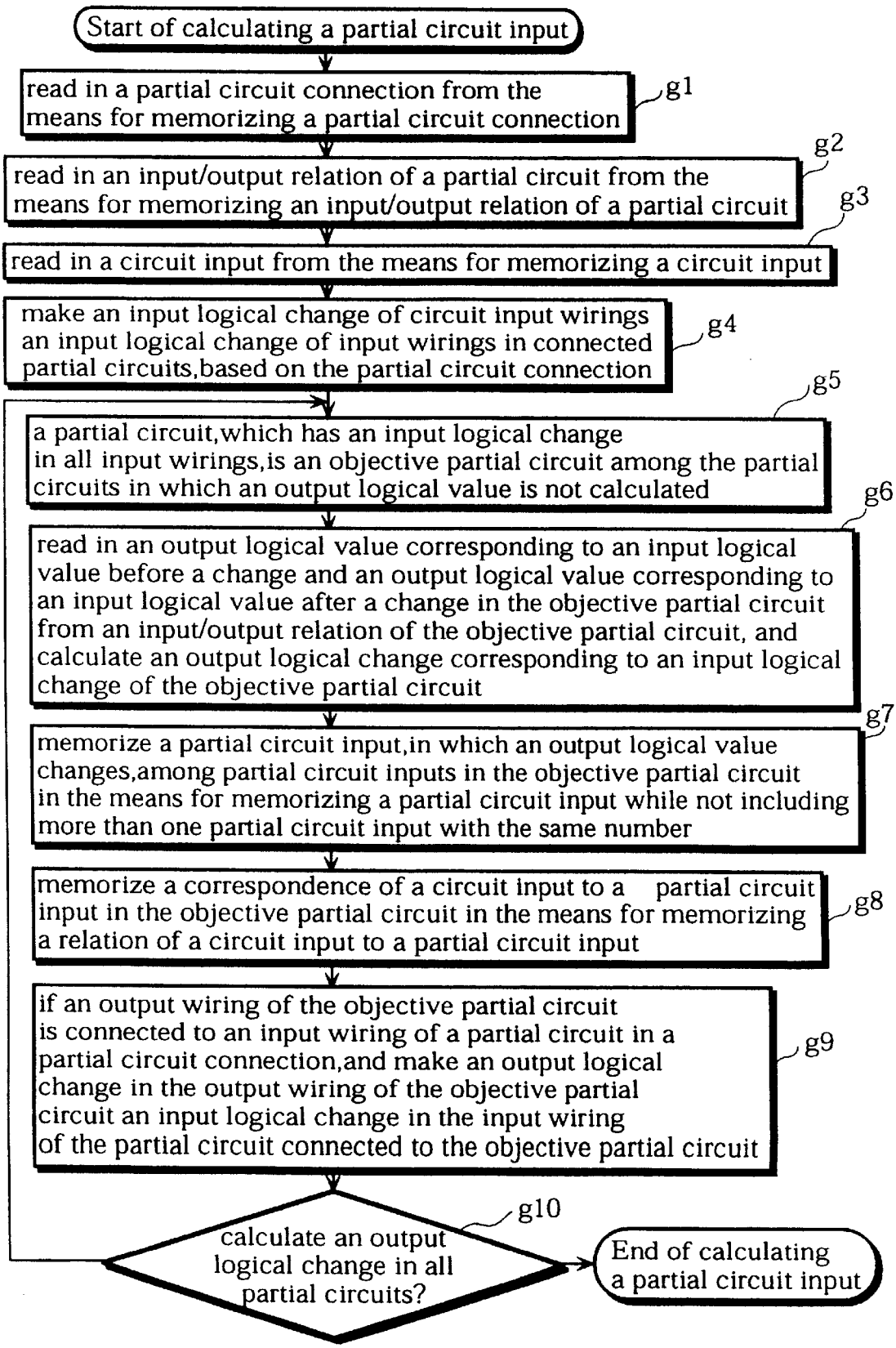
FIG. 19 is a view showing a procedure in calculating an input of a partial circuit shown in FIG. 2.

The means for calculating a partial circuit input 112 executes functions shown in FIG. 19. That is:

(A step g1) A partial circuit connection shown in FIG. 17, which is memorized in the means for memorizing a partial circuit connection 104, is read in.

(A step g2) An input/output relation of a partial circuit shown in FIG. 3, which is memorized in the means for memorizing an input/output relation of a partial circuit 105, is read in.

(A step g3) A circuit input shown in FIG. 15, which is memorized in the means for memorizing a circuit input 102, is read in.

(A step g4) An input logical change of circuit input wirings IN1 and IN2 shown in FIG. 15 is made an input logical change of input wirings (IN1 and IN2 in a partial circuit P01, IN1 and IN2 in a partial circuit P02) in connected partial circuits, based on a par circuit connection shown in FIG. 1.

(A step g5) The partial circuit P01, which has an input logical change in all input wirings and is on the upper stream side of the partial circuit P02, is an objective partial circuit among the partial circuits P01 and P02 in which an output logical value is not calculated.

(A step g6) An output logical value corresponding to an input logical value before a change and an output logical value corresponding to an input logical value after a change in the partial circuit P01 are read in from an input/output relation of the partial circuit P01 shown at 301 of FIG. 3, and an output logical change corresponding to an input logical change of the partial circuit P01 is calculated in a form shown at 2001 of FIG. 20.

(A step g7) A partial circuit input, in which an output logical value changes (an output logical change with circuit input numbers of 3, 6, 9, 10, 11 and 12 at 2001 of FIG. 20), among partial circuit inputs in the partial circuit P01 is memorized in a form shown at 401 of FIG. 4 in the means for memorizing a partial circuit input 106 while not including more than one partial circuit input with the same contents. A partial circuit input number is given to each input logical change for distinguishing each logical change as shown in FIG. 4. Consequently, circuit input numbers of 3, 6, 9, 10, 11 and 12 in the partial circuit P01 in FIG. 20 correspond to partial circuit input numbers of 1, 2, 3, 4, 5 and 6 in the partial circuit P01 in FIG. 4 respectively.

(A step g8) A correspondence of a circuit input to a partial circuit input in the partial circuit P01 is memorized in a form shown at 2101 of FIG. 21 in the means for memorizing a relation of a circuit input to a partial circuit input 107.

In FIG. 21, '-' indicates the case of no partial circuit input number corresponding to a circuit input number.

(A step g9) Since an output wiring N11 of the partial circuit P01 is connected to an input wiring N11 of the partial circuit P02 in a partial circuit connection shown in FIG.

17, an output logical change in the output wiring N11 of the partial circuit P01 shown at 2001 of FIG. 20 is made an input logical change in the input wiring N11 of the partial circuit P02 connected to the partial circuit P01.

(A step g10) Whether an output logical change is calculated in all partial circuits is checked, and since an output logical change of the partial circuit P02 is not calculated, return to a step g5.

(A step g5) The partial circuit P02, which has an input logical change in all input wirings and in which an output logical value is not calculated, is an objective partial circuit.

(A step g6) An output logical value corresponding to an input logical value before a change and an output logical value corresponding to an input logical value after a change in the partial circuit P02 are read in from an input/output relation of the partial circuit P02 shown at 302 of FIG. 3, and an output logical change corresponding to an input logical change of the partial circuit P02 is calculated in a form shown at 2002 of FIG. 20.

(A step g7) A partial circuit input, in which an output logical value changes (an output logical change with circuit input numbers of 1, 2, 4, 6, 7, 9, 11 and 12 at 2002 of FIG. 20), among partial circuit inputs in the partial circuit P02 is memorized in a form shown at 402 of FIG. 4 in the means for memorizing a partial circuit input 106 while not including more than one partial circuit input with the same contents.

(A step g8) A correspondence of a circuit input to a partial circuit input in the partial circuit P02 is memorized in a form shown at 2102 of FIG. 21 in the means for memorizing a relation of a circuit input to a partial circuit input 107.

(A step g9) Since an output wiring OUT of the partial circuit P02 is connected to no input wiring of a partial circuit in a partial circuit connection shown in FIG. 17, no processing is executed.

Figure 22:
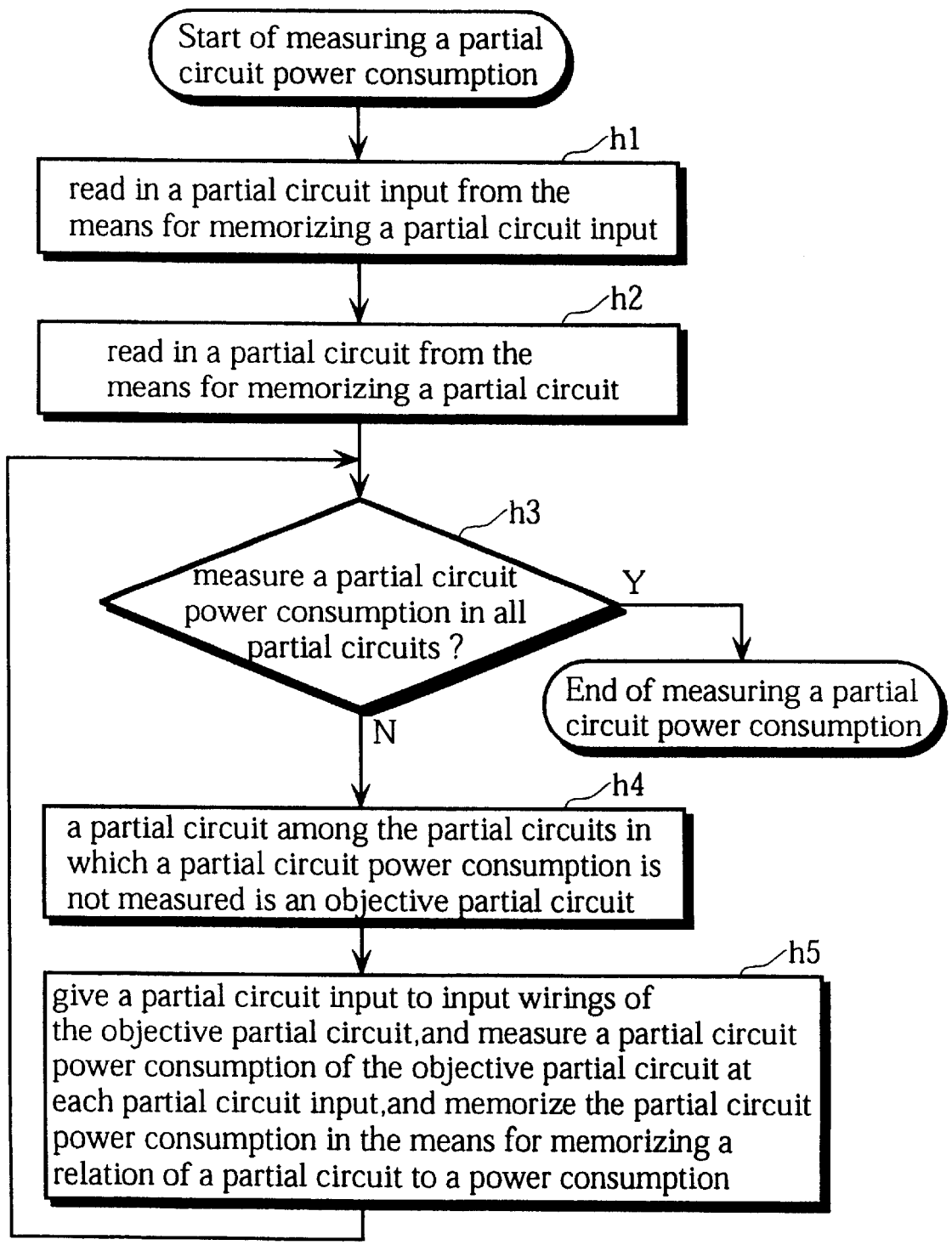
FIG. 22 is a view showing a procedure in measuring a power consumption of a partial circuit.

(A step g10) Whether an output logical change is calculated in all partial circuits is checked, and since an output logical change of the partial circuits P01 and P02 is calculated, calculating a partial circuit input 112 is completed. The means for measuring a partial circuit power consumption 113 executes functions shown in FIG. 22. That is:

(A step h1) A partial suit input shown in FIG. 4 is read in from the means for memorizing a partial circuit input 106.

(A step h2) A partial circuit shown in FIG. 2 is read in from the means for memorizing a partial circuit 103.

(A step h3) Whether a partial circuit power consumption is measured in all partial circuits P01 and P02 is checked, and if not, go to a step h4.

(A step h4) The partial circuit P01 among the partial circuits P01 and P02 in which a partial circuit power consumption is not measured is an objective partial circuit.

(A step h5) A partial circuit input shown at 401 of FIG. 4 is given to input wirings IN1 and IN2 of the partial circuit P01 shown at P01 of FIG. 2, and a partial circuit power consumption of the partial circuit P01 is measured at each partial circuit input (partial circuit input numbers of 1, 2, 3, 4, 5 and 6) under the abovementioned procedure, and the partial circuit power consumption is memorized in a form shown at 2301 of FIG. 23 in the means for memorizing a relation of a partial circuit input to a power consumption 108.

(A step h3) Whether a partial circuit power consumption is measured in al partial circuits P01 and P02 is checked, and since a partial circuit power consumption of the partial circuit P02 is not measured, go to a step h4.

(A step h4) The partial circuit P02 in which a partial circuit power consumption is not measured is an objective partial circuit.

(A step h5) A partial circuit input shown at 402 of FIG. 4 is given to input wirings IN1, IN2 and N11 of the partial circuit P02 shown at P02 of FIG. 2, and a partial circuit power consumption of the partial circuit P02 is measured at each partial circuit input (partial circuit input numbers of 1, 2, 3, 4, 5, 6, 7 and 8), and the partial circuit power consumption is memorized in a form shown at 2302 of FIG. 23 in the means for memorizing a relation of a partial circuit input to a power consumption 108.

(A step h3) Whether a partial circuit power consumption is measured in all partial circuits P01 and P02 is checked, and since a partial circuit power consumption of the partial circuits P01 and P02 is measured, measuring a partial circuit power consumption 113 is completed.

Figure 24:
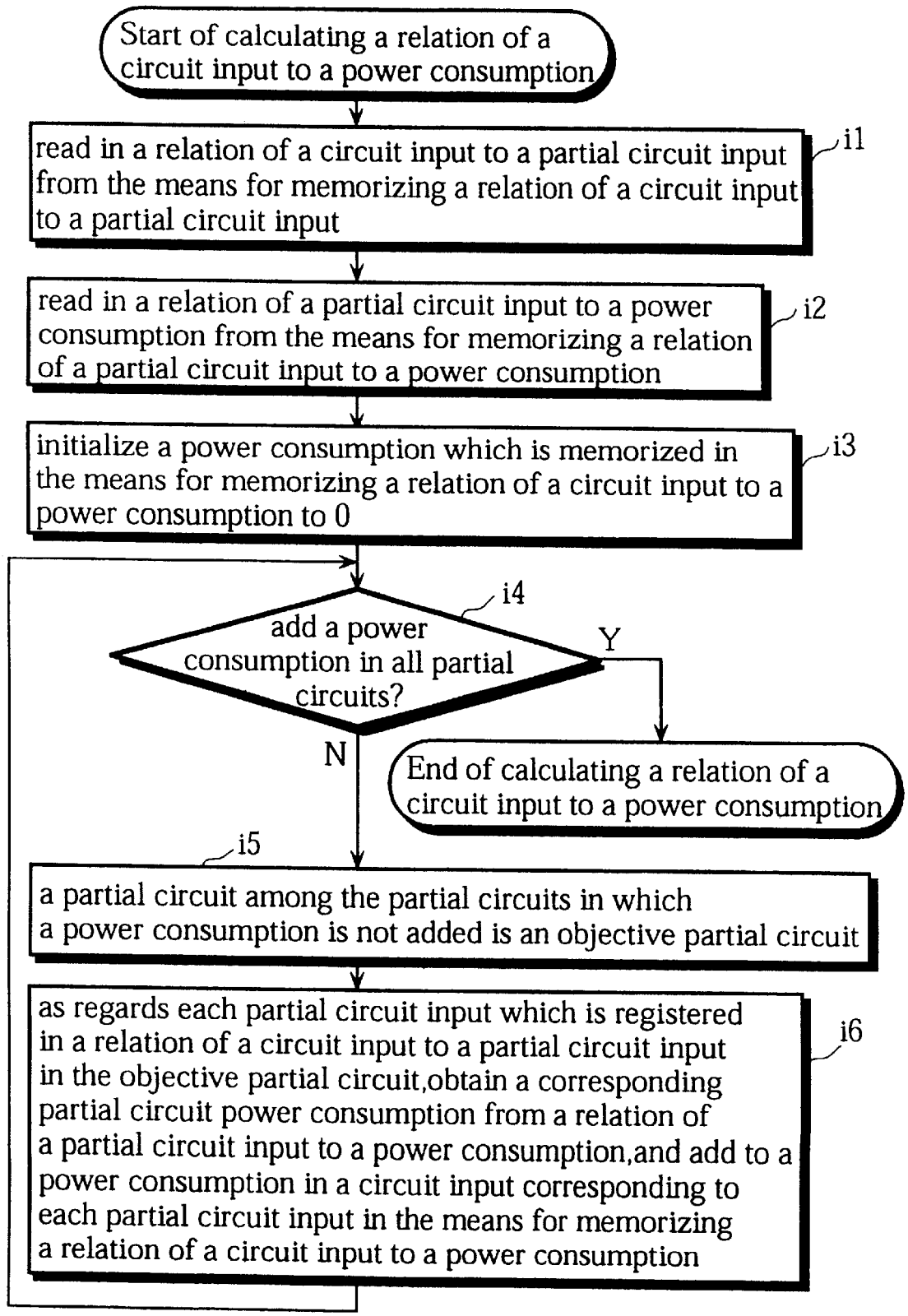
FIG. 24 is a view showing a procedure in calculating a relation of a circuit input to a power consumption.

The means for calculating a relation of a circuit input to a power consumption 114 executes functions shown in FIG. 24. That is:

(A step i1) A relation of a circuit input to a partial circuit input shown in FIG. 21 is read in from the means for memorizing a relation of a circuit input to a partial circuit input 107.

(A step i2) A relation of a partial circuit input to a power consumption shown in FIG. 23 is read in from the means for memorizing a relation of a partial circuit input to a power consumption 108.

(A step i3) A power consumption in each circuit input in the means for memorizing a relation of a circuit input to a power consumption 109 is initialized to 0.

(A step i4) Whether a power consumption is added in all partial circuits P01 and P02 is checked, and if not, go to a step is.

(A step i5) The partial circuit P01 among the partial circuits P01 and P02 in which a power consumption is not added is an objective partial circuit.

(A step i6) As regards each partial circuit input (partial circuit input numbers of 1, 2, 3, 4, 5 and 6) which is registered in a relation of a circuit input to a partial circuit input in the partial circuit P01 shown at 2101 of FIG. 21, a corresponding partial circuit power consumption (80, 90, 90, 100, 70 and 70) is obtained from a relation of a partial circuit input to a power consumption shown at 2301 of FIG. 23, and the partial circuit power consumption is added to a power consumption in a circuit input (circuit input numbers of 3, 6, 9, 10, 11 and 12) corresponding to each partial circuit input (partial circuit input numbers of 1, 2, 3, 4, 5 and 6) in the means for memorizing a relation of a circuit input to a power consumption 109.

(A step i4) Whether a power consumption is added in all partial circuits P01 and P02 is checked, and since a power consumption of the partial circuit P02 is not added, go to a step i5.

(A step i5) The partial circuit P02 in which a power consumption is not added is an objective partial circuit.

(A step i6) As regards each partial circuit input (partial circuit input numbers of 1, 2, 3, 4, 5, 6, 7 and 8) which is re-red in a relation of a circuit input to a partial circuit input in the partial circuit P02 shown at 2102 of FIG. 21, a corresponding partial circuit power consumption (90, 90, 140, 100, 140, 100, 150 and 150) is obtained from a relation of a partial circuit input to a power consumption shown at 2302 of FIG. 23, and the partial circuit power consumption is added to a power consumption in a circuit input (circuit input numbers of 1, 2, 4, 6, 7, 9, 11 and 12)

corresponding to each partial circuit input partial circuit input numbers of 1, 2, 3, 4, 5, 6, 7 and 8) in the means for memorizing a relation of a circuit input to a power consumption 109.

(A step i4) Whether a power consumption is added in all partial circuits P01 and P02 is checked, and since a power consumption of the partial circuits P01 and P02 is added, calculating a relation of a circuit input to a power consumption 114 is completed.

Under the above steps, a power consumption of a circuit network is output in a corresponding table at each logical value and its change of an input circuit.

As understood by the above description, assuming that it takes a minute to measure a power consumption of each of the partial circuits P01 and P02 in an input logical change, since an input change into the partial circuit P01 has six sorts as shown at 401 of FIG. 4 and an input change into the partial circuit P02 has eight sorts as shown at 402 of FIG. 4 in Embodiment 1, the time for measuring a power consumption is only fourteen minutes in total and shorter than twenty-four minutes in a general method as a conventional example and thirty-six minutes in a method of CB-Power.

Moreover, in the case of a hundred kinds of partial circuits, if each one kind of a partial circuit is used twice in the whole circuit, the time for measuring a power consumption is only 1,400 minutes of 14×100 in Embodiment 1 and shorter than 1,800 minutes in a method of CB-Power (Embodiment 2)

Embodiment 2 relates to the reduction of a partial circuit input.

Figure 25:
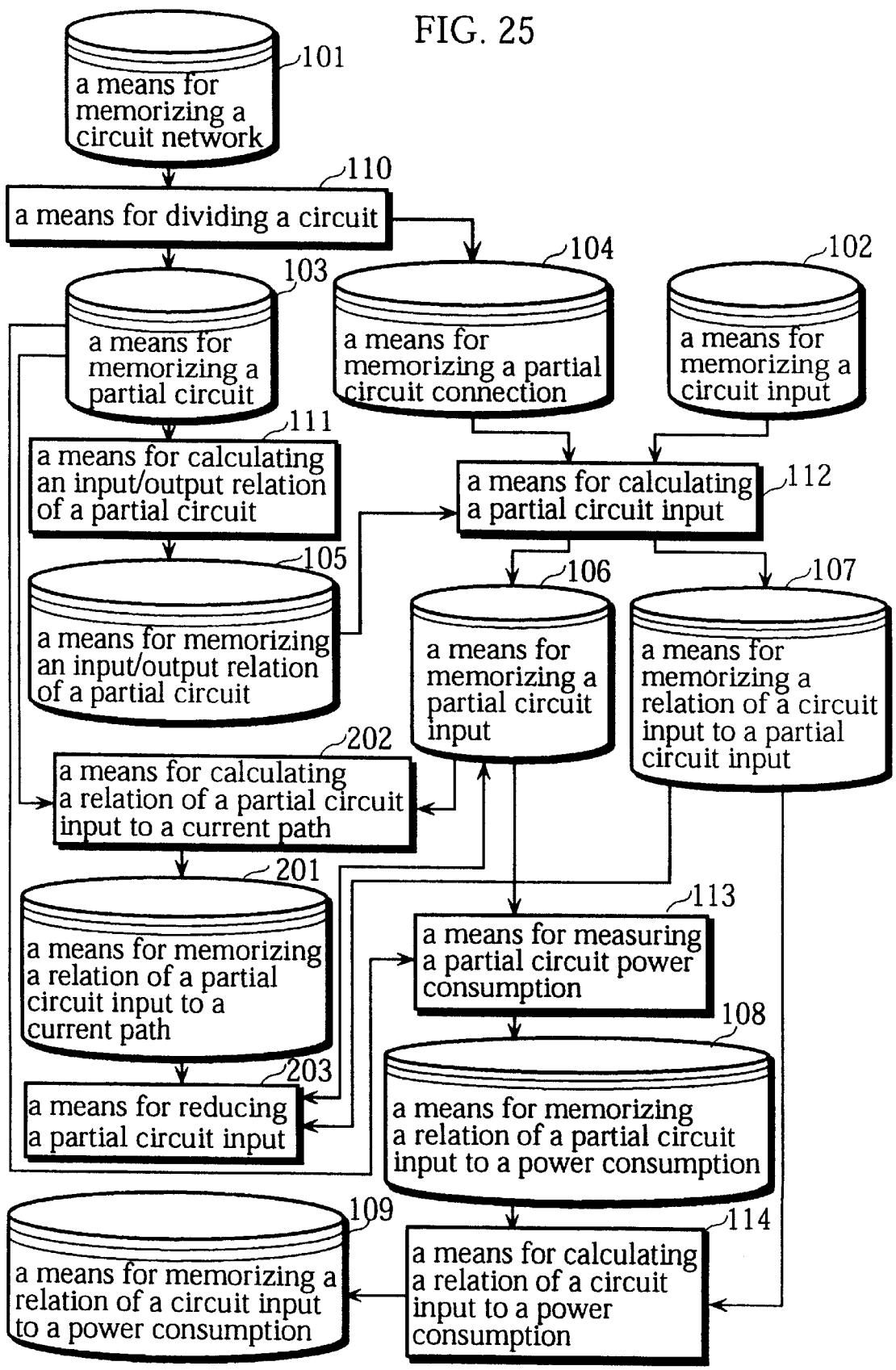
FIG. 25 is a constitution view of a means of calculating a power consumption characteristic in Embodiment 2 of the present invention.

FIG. 25 is a constitution view of a device of measuring a power consumption characteristic in Embodiment 2 of the present invention.

The device of measuring a power consumption characteristic comprises a means for memorizing a circuit network 101, a means for memorizing a circuit input 102, a means for memorizing a partial circuit 103, a means for memorizing a partial circuit connection 104, a means for memorizing an input/output relation of a partial circuit 105, a means for memorizing a partial circuit input 106, a means for memorizing a relation of a circuit input to a partial circuit input 107, a means for memorizing a relation of a partial circuit input to a power consumption 108, a means for memorizing a relation of a circuit input to a power consumption 109, a means for dividing a circuit 110, a means for calculating an input/output relation of a partial circuit 111, a means for calculating a partial circuit input 112, a means for measuring a partial circuit power consumption 113, a means for calculating a relation of a circuit input to a power consumption 114, a means for memorizing a relation of a partial circuit input to a current path 201, a means for calculating a relation of a partial circuit input to a current path 202, and a means for reducing a partial circuit input 203.

Among the above components, the same name and number are given to the components having the same function and an effect as in Embodiment 1, and a description of them is omitted.

The components which are peculiar to Embodiment 2 are described below.

Figure 26:
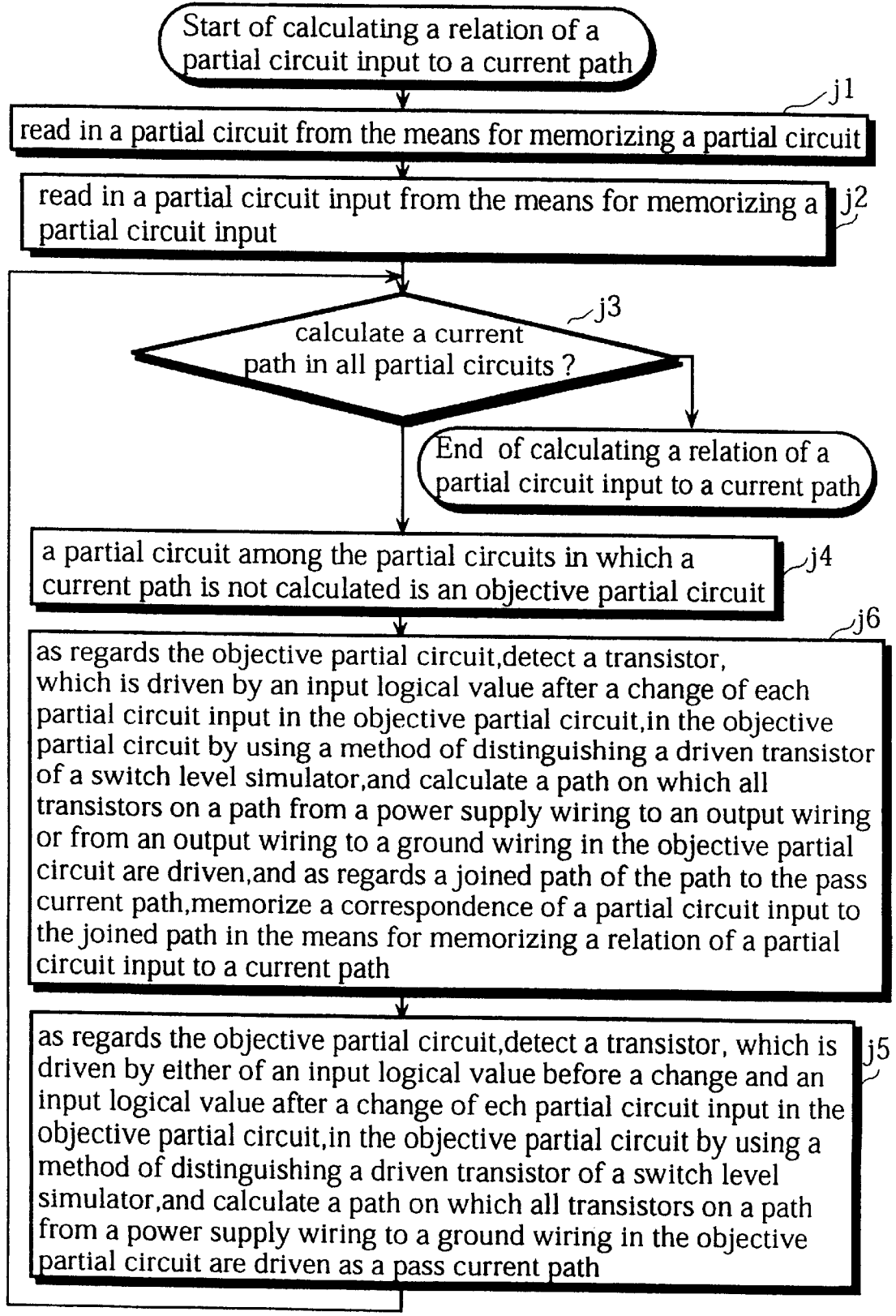
FIG. 26 is a view showing a procedure in calculating a relation of a partial circuit input to a pass current path.

The means for calculating a relation of a partial ciruit input to a current path 202 executes functions shown in FIG. 26. That is:

(A step j1) A partial circuit shown in FIG. 2, which is memorized in the means for memorizing a partial circuit 103, is read in.

(A step j2) A partial circuit input shown in FIG. 4, which is memorized in the means for memorizing a partial circuit input 106, is read in.

(A step j3) Whether a current path is calculated in all partial circuits P01 and P02 is checked, and if not, go to a step j4.

(A step j4) The partial circuit P01 among the partial circuits P01 and P02 in which a current path is not calculated is an objective partial circuit.

(A step j5) As regards the partial circuit P01, a transistor driven by either of an input logical value before a change and an input logical value after a change of each partial circuit input in the partial circuit P01 shown at 401 of FIG. 4 is detected in the partial circuit P01 shown in FIG. 2 by using a method of distinguishing a driven transistor of a switch level simulator, and a path on which all transistors on a path from a power supply wiring VDD1 to a ground wiring GND1 in the partial circuit P01 are driven is calculated as a pass current path.

(A step j6) As regards the partial circuit P01, a transistor driven by an input logical value after a change of each partial circuit input in the partial it P01 shown at 401 of FIG. 4 is detected in the partial circuit P01 shown in FIG. 2 by using a method of distinguishing a driven transistor of a switch level simulator, and a path on which al transistors on a path from a power supply wiring VDD1 to an output wiring N11 or from an output wiring N11 to a ground wiring GND1 in the partial circuit P01 are driven is calculated, and as regards a joined path of the path to the pass current path, a correspondence of a partial circuit input to the joined path is memorized in a form shown at 501 of FIG. 5 in the means for memorizing a relation of a partial circuit input to a current path 201.

(A step j3) Whether a current path is calculated in al partial circuits P01 and P02 is checked, and since a current path of the partial circuit P02 is not calculated, go to a step j4.

(A step j4) The partial circuit P02 in which a current path is not calculated is an objective partial circuit.

(A step j5) As regards the partial circuit P02, a transistor driven by either of an input logical value before a change and an input logical value after a change of each partial circuit input in the partial circuit P02 shown at 402 of FIG. 4 is detected in the partial circuit P02 shown in FIG. 2 by using a method of distinguishing a driven transistor of a switch level simulator, and a path on which all transistors on a path from a power supply wiring VDD2 to a ground wiring GND2 in the partial circuit P02 are driven is calculated as a pass current path.

(A step j6) As regards the partial circuit P02, a transistor driven by an input logical value after a change of each partial circuit input in the part circuit P02 shown at, 402 of FIG. 4 is detected in the partial circuit P02 shown in FIG. 2 by using a method of distinguishing a driven transistor of a switch level simulator, and a path on which all transistors on a path from a power supply wiring VDD2 to an output wiring OUT or from an output wiring OUT to a ground wiring GND2 in the partial circuit P02 are driven is calculated, and as regards a joined path of the path to the pass current path, a correspondence of a partial circuit input to a current path is memorized in a form shown at 502 of FIG. 5 in the means for memorizing a relation of a partial circuit input to a current path 201.

(A step j3) Whether a current path is calculated in all partial circuits P01 and P02 is checked, and since a current path in the partial circuits P01 and P02 is calculated, calculating a relation of a partial circuit input to a current path 202 is completed.

Figure 27:
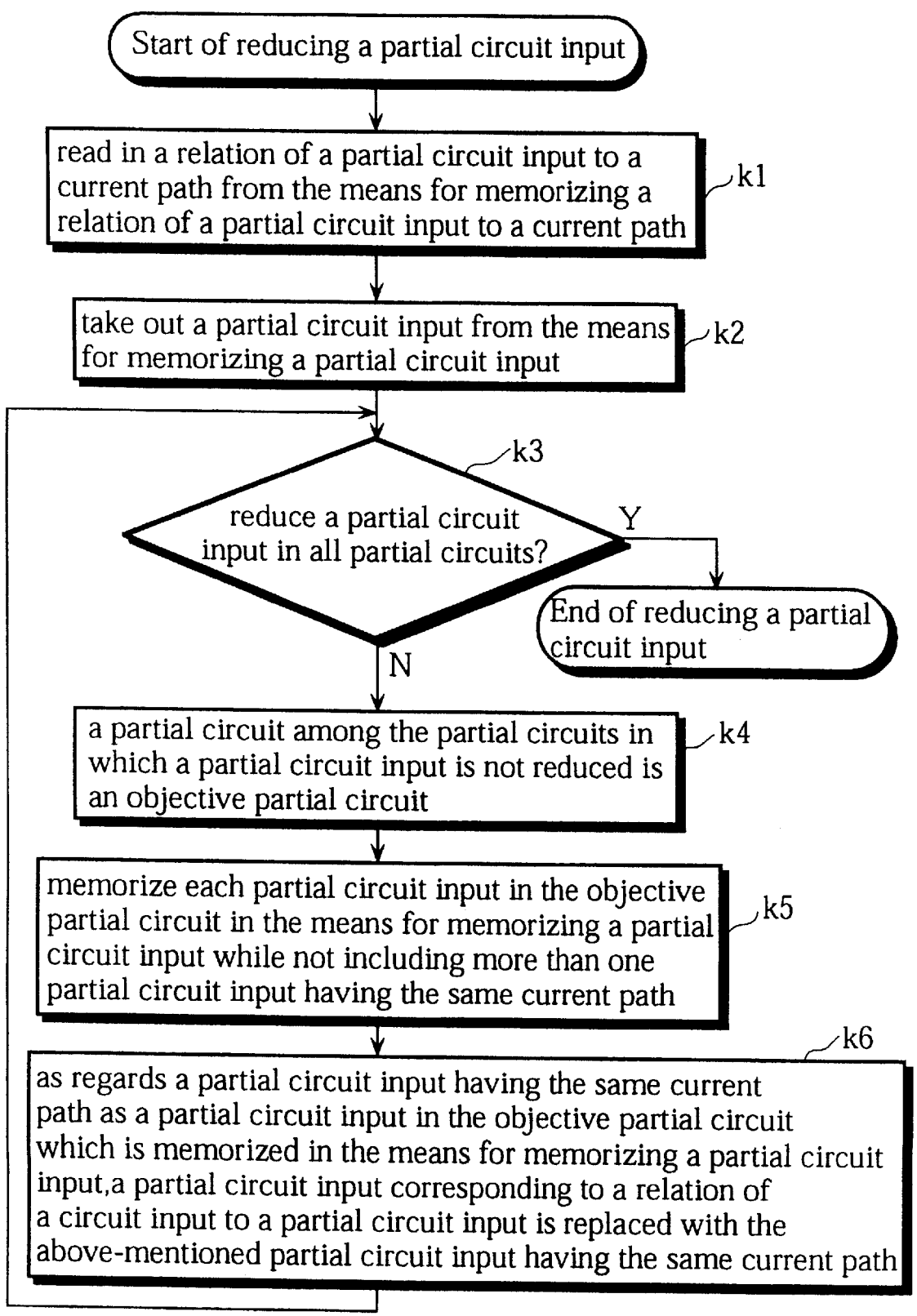
FIG. 27 is a view showing a procedure in reducing a partial circuit input.

The means for reducing a partial circuit input 203 executes functions shown in FIG. 27. That is:

(A step k1) A relation of a partial circuit input to a current path shown in FIG. 19, which is memorized in the means for memorizing a relation of a partial circuit input to a current path 201, is read in.

(A step k2) A partial circuit input shown in FIG. 4, which is memorized in the means for memorizing a partial circuit input 106, is taken out.

(A step k3) Whether a partial circuit input is reduced in all partial circuits P01 and P02 is checked, and if not, go to a step k4.

(A step k4) The part circuit P01 among the partial circuits P01 and P02 in which a partial circuit input is not reduced is an objective partial circuit.

(A step k5) Each partial circuit input in the partial circuit P01 is memo memorized in a form shown at 2801 of FIG. 28 in the means for memorizing a partial circuit input 106 while not including more than one partial circuit input having the same current path. However, since the partial circuit P01 has no partial circuit input having the same current path, the form shown at 2801 of FIG. 28 is the same as the form shown at 401 of FIG. 4.

(A step k6) As regards a partial circuit input having the same current path as a partial circuit input in the partial circuit P01 shown at 2801 of FIG. 28 which is memorized by the step k5 in the means for memorizing a partial circuit input 106, a partial circuit input corresponding to a relation of a circuit input to a partial circuit input shown at 2101 of FIG. 21 which is memorized in the means for memorizing a relation of a circuit input to a partial circuit input 107 is replaced as shown at 2801 of FIG. 28 with the above-mentioned partial circuit input having the same current path. However, since the partial circuit P01 has no partial circuit input having the same current path, the form shown at 2801 of FIG. 28 is the same as the form shown at 2101 of FIG. 21.

(A step k3) Whether a partial circuit input is reduced in all partial circuits P01 and P02 is checked, and since a partial circuit input in the partial circuit P02 is not reduced, go to a step k4.

(A step k4) The partial circuit P02 in which a partial circuit input is not reduced is an objective partial circuit.

(A step k5) Each partial circuit input in the partial circuit P02 is memorized in a form shown at 2802 of FIG. 28 in the means for memorizing a partial circuit input 106 while not including more than one partial circuit input (partial circuit input numbers of 4 and 6, 7 and 8) having the same current path.

(A step k6) As regards a partial circuit input (partial circuit input numbers of 4 and 6, 7 and 8) having the same current path as a partial circuit input in the partial circuit P02 shown at 2802 of FIG. 28 which is memorized by the step k5 in the means for memorizing a partial circuit input 106, a partial circuit input partial circuit input numbers of 6, 8) corresponding to a relation (circuit input numbers of 9, 12) of a circuit input to a partial circuit input shown at 2102 of FIG. 21 which is memorized in the means for memorizing a relation of a circuit input to a partial circuit input 107 is replaced as shown at 2802 of FIG. 28 with the abovementioned partial circuit input (partial circuit input numbers of 4, 7) having the same current path.

(A step k3) Whether a partial circuit input is reduced in all partial circuits P01 and P02 is checked, and since a partial circuit input in the partial circuits P01 and P02 is reduced, reducing a partial circuit input 203 is completed The means for measuring a partial circuit power consumption 113 calculates a relation of a partial circuit input to a power consumption shown FIG. 30 from a partial circuit input change shown FIG. 29 and a partial circuit shown FIG. 2 by the same processing as in Embodiment 1 according to the above difference of the constitution.

The means for calculating a relation of a circuit input to a power consumption 114 calculates a relation of a circuit input to a power consumption shown FIG. 31 from a relation of a circuit input to a partial circuit input shown FIG. 28 and a relation of a partial circuit input to a power consumption shown FIG. 30 by the same processing as in Embodiment 1 according to the above difference of the constitution.

As described above, assuming that it takes a minute to measure a power consumption of each of the partial circuits P01 and P02 in an input logical change, since an input change into the partial circuit P01 has six sorts as shown at 2901 of FIG. 29 and an input change into the partial circuit P02 has six sorts as shown at 2902 of FIG. 29 in Embodiment 2, the time for measuring a power consumption is only twelve minutes in total and shorter than fourteen minutes in Embodiment 1, twenty-four minutes in a general method as a conventional example and thirty-six minutes in a method of CB-Power.

Moreover, in the case of a hundred kinds of partial circuits, if each one kind of a partial it is used twice in the whole circuit, the time for measuring a power consumption is only 1,200 minutes of 12×100 in Embodiment 2 and shorter than 1,800 minutes in a method of CB-Power.

If each one kind of a partial circuit is used three times in the whole circuit, the time for measuring a power consumption in Embodiment 2 is equal to 1,200 minutes in a method of CB-Power.

Embodiment 2 is applied to a partial circuit and is applicable to the whole circuit network according to the above-mentioned procedure shown in FIG. 8. In this case, although an input logical change for measuring a power consumption is not greatly reduced, a power consumption can be measured in a conventional method without dividing into partial circuits.

As understood by the above description, it is possible in Embodiment 2 to reduce the number of partial circuit inputs for measuring a power consumption by reducing a partial circuit input having the same current path.

It is possible to calculate a current path at a high speed without executing a circuit simulator in which it takes a long time for processing.

Furthermore, it is possible to reduce the time for measuring a power consumption by reducing a partial circuit input having the same current path.

(Embodiment 3)

Embodiment 3 relates to the reduction of a current path.

Since a basic constitution of Embodiment 3 is the same as Embodiment 2 shown in FIG. 25, FIG. 25 is used in Embodiment 3.

The means for calculating a relation of a partial circuit input to a current path 202 calculates a correspondence of a partial circuit input to a current path from a partial circuit shown FIG. 2 and a partial circuit input shown FIG. 4 by the same processing as in Embodiment 2, and the correspondence is memorized in a form shown at 501 of FIG. 5 in the means for memorizing a relation of a partial circuit input to a current path 201.

Figure 32:
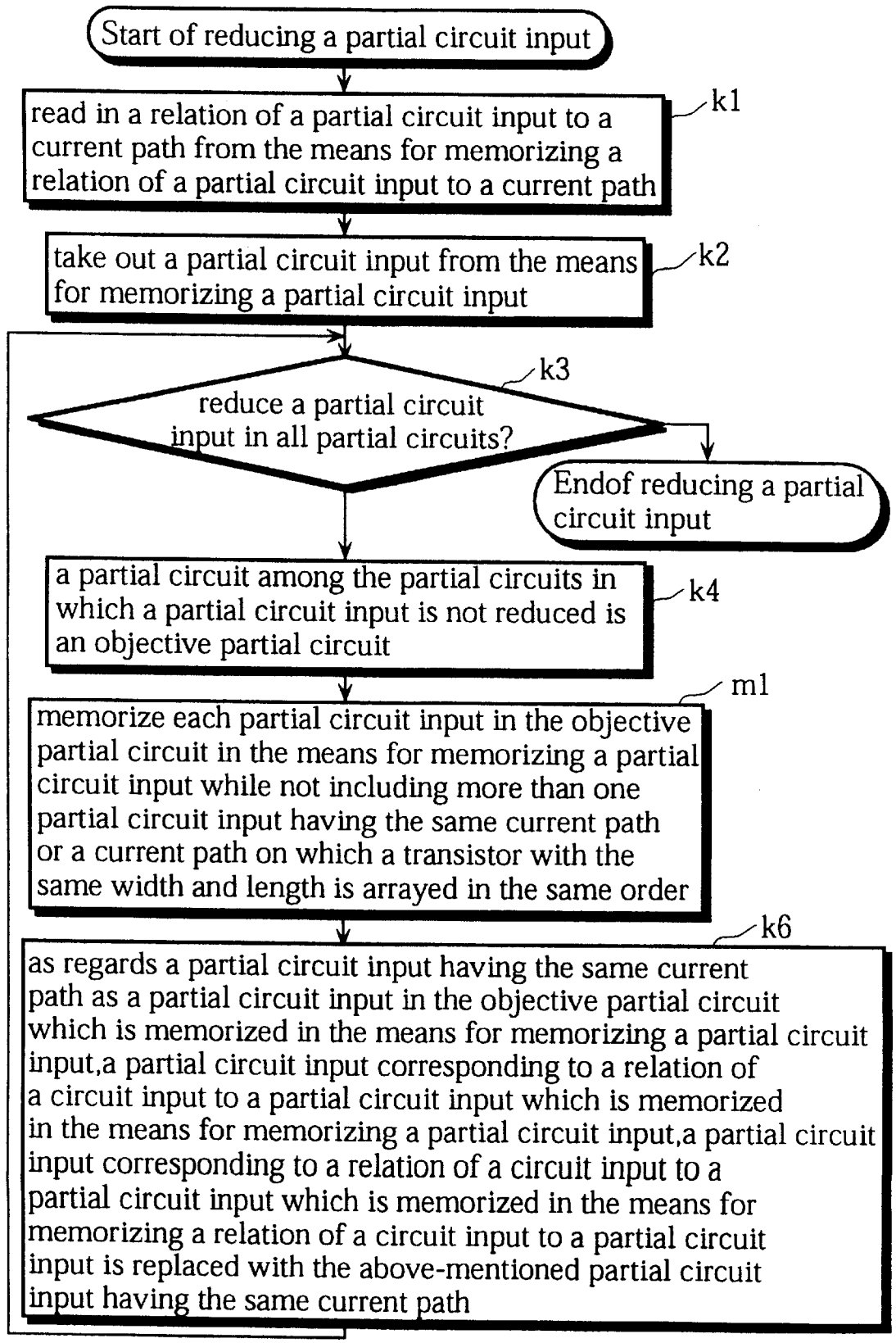
FIG. 32 is a view showing a procedure in reducing a partial circuit input.

The means for reducing a partial circuit input 203 executes functions shown in FIG. 32. However, steps of k1, k2, k3 and k4 in FIG. 32 are the same as FIG. 27 in Embodiment 2. Consequently, a description of them is omitted.

(A step m1) After the step k4, each partial circuit input in the first partial circuit P01 is memorized in a form shown at 3301 of FIG. 33 in the means for memorizing a partial circuit input 106 while not including more than one partial circuit input (partial circuit input numbers of 2 and 3, 5 and 6) having the same current path or a current path on which a transistor with the same width and length is arrayed in the same order.

(A step k6) As regards a partial circuit input (para circuit input numbers of 2 and 3, 5 and 6) having the same current path as a partial circuit input in the partial circuit P01 shown at 3301 of FIG. 33 which is memorized by the step m1 in the means for memorizing a partial circuit input 106, a partial circuit input partial circuit input numbers of 3, 6) corresponding to a relation (circuit input numbers of 9, 12) of a circuit input to a partial circuit input shown at 2101 of FIG. 21 which is memorized in the means for memorizing a relation of a circuit input to a partial circuit input 107 is replaced as shown at 3401 of FIG. 34 with the abovementioned partial circuit input (partial circuit input numbers of 2, 5) having the same current path. Then, go to a step k3.

(A step m1) After the step k4, each partial circuit input in the second partial circuit P02 is memorized in a form shown at 3302 of FIG. 33 in the means for memorizing a partial circuit input 106 while not including more than one partial circuit input (partial circuit input numbers of 1 and 2, 3 and 5, 4 and 6, 7 and 8) having the same current path or a current path on which a transistor with the same width and length is arrayed in the same order.

(A step k6) As regards a partial circuit input (partial circuit input numbers of 1 and 2, 3 and 5, 4 and 6, 7 and 8) having the same current path as a partial circuit input in the partial circuit P02 shown at 3302 of FIG. 33 which is memorized by the step m1 in the means for memorizing a partial circuit input 106, a partial circuit input partial circuit input numbers of 2, 5, 6, 8) corresponding to a relation (circuit input numbers of 2, 7, 9, 12) of a circuit input to a partial circuit input shown at 2102 of FIG. 21 which is memorized in the means for memorizing a relation of a circuit input to a partial circuit input 107 is replaced as shown at 3402 of FIG. 34 with the abovementioned partial circuit input (partial circuit input numbers of 1, 3, 4, 7) having the same current path. Then, go to a step k3.

(A step k3) Like Embodiment 2, whether a partial circuit input is reduced in all partial circuits P01 and P02 is checked, and since a partial circuit input in the partial circuits P01 and P02 is reduced, reducing a partial circuit input 203 is completed.

The means for measuring a partial circuit power consumption 113 calculates a relation of a partial circuit input to a power consumption shown FIG. 35 from a partial circuit input change shown FIG. 33 and a partial circuit shown FIG. 2 by the same processing as in Embodiment 1 according to the above difference of the constitution.

The means for calculating a relation of a circuit input to a power consumption 114 calculates a relation of a circuit input to a power consumption shown FIG. 31 from a relation of a circuit input to a partial circuit input shown FIG. 34 and a relation of a partial circuit input to a power consumption shown FIG. 35 by the same processing as in Embodiment 1 according to the above difference of the constitution.

As described above, assuming that it takes a minute to measure a power consumption of each of the partial circuits P01 and P02 in an input logical change, since an input change into the partial circuit P01 has four sorts as shown at 3301 of FIG. 33 and an input change into the partial circuit P02 has four sorts as shown at 3302 of FIG. 33 in Embodiment 2, the time for measuring a power consumption is only eight minutes in total and shorter than fourteen minutes in Embodiment 1, twenty-four minutes in a general method as a conventional example and thirty-six minutes in a method of CB-Power.

Moreover, in the case of a hundred kinds of partial circuits, if each one kind of a partial circuit is used twice in the whole circuit, the time for measuring a power consumption is only 800 minutes of 8×100 in Embodiment 2 and shorter than 1,800 minutes in a method of CB-Power.

If each one kind of a partial circuit is used three times in the whole circuit, the time for measuring a power consumption in Embodiment 2 is shorter than 1,200 minutes in a method of CB-Power.

If each one kind of a partial circuit is used four times in the whole circuit, the time for measuring a power consumption in Embodiment 2 is shorter than 900 minutes in a method of CB-Power.

As understood by the above description, furthermore, it is possible in Embodiment 3 to reduce the time for measuring a power consumption by reducing a partial circuit input regarding the same current path.

(Embodiment 4)

Embodiment 4 relates to the reduction of an input logical value into each partial circuit That is, as described in 'Summary of the Invention', many combinations do not exist undoubtedly in a combination of an input logical value into each actual partial circuit depending to an input from a partial circuit on the upper stream side and outside.

Accordingly, after dividing a circuit network into a partial circuit and making a connection of each partial circuit, an input/output relation of a partial Circuit is made sequentially from each partial circuit on the upper stream side at each input logical value from outside, and thereby it is not necessary to calculate an input/output relation in the combinations of an input logical value, which do not exist undoubtedly, in a partial circuit on the lower stream side and, additionally, calculate a power consumption characteristic eventually. Furthermore, it is possible to calculate more efficiently.

A processing which is peculiar to Embodiment 4 and a result of each processing are described below while referring to FIG. 36.

Figure 36:
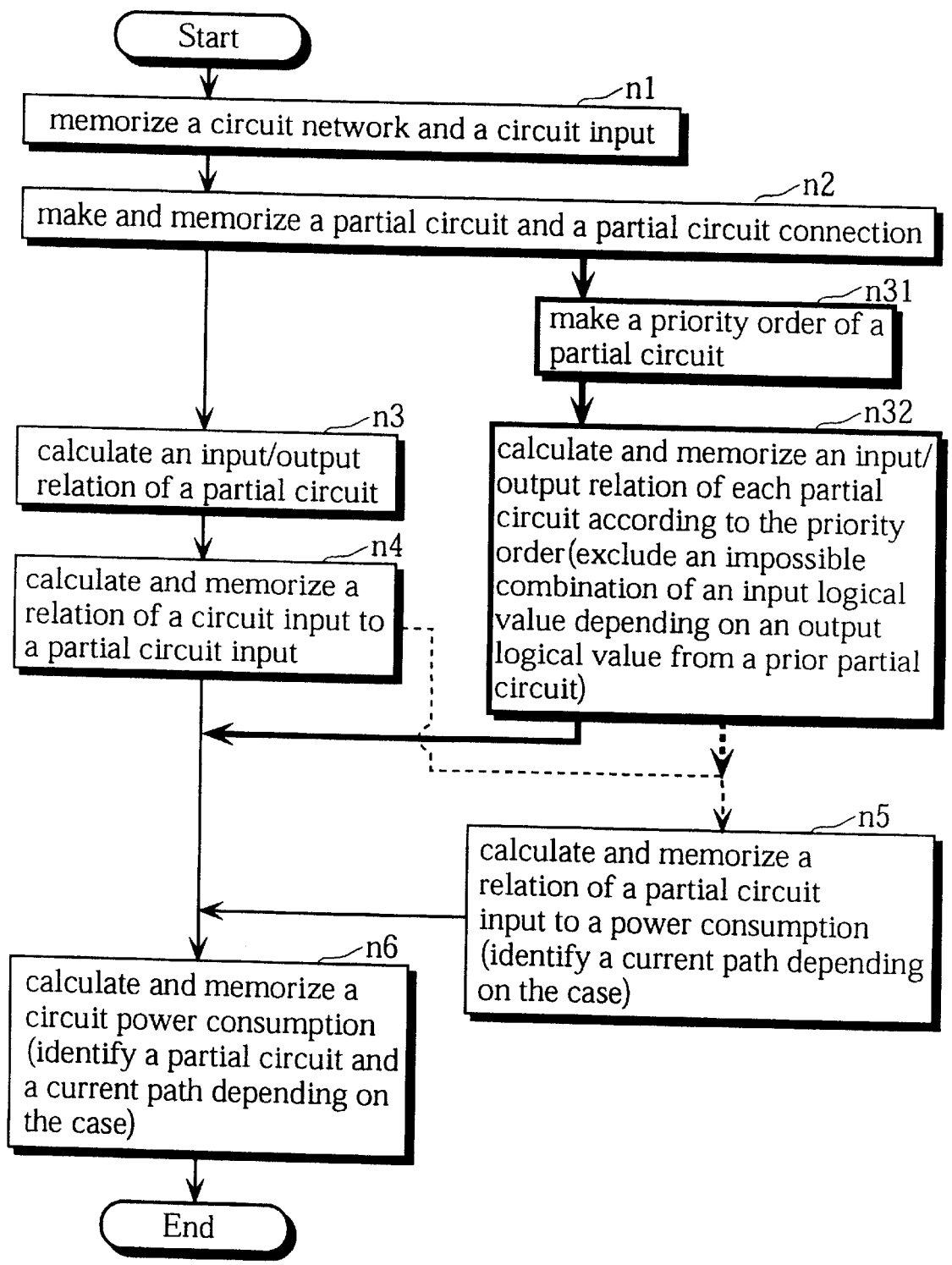
FIG. 36 is a view describing a flow of a processing and an information in Embodiment 4 of the present invention.

A processing of a means of calculating a power consumption characteristic in the present invention and a result of the processing are shown in FIG. 36, and a processing which is peculiar to Embodiment 4 and a result of the processing are shown in a black thick line or a black thick frame.

Since a processing and a result in steps of n1 to n6 shown in FIG. 36 are already described, a second description of them is omitted.

In Embodiment 4, a step n3 of calculating and memorizing an input/output relation of a partial circuit and a step n4 of calculating and memorizing a relation of a circuit input to a partial circuit input are replaced with a step n31 of making a priority order of a partial circuit and a step n32 of calculating and memorizing an input/output relation of a partial circuit and a relation of a circuit input to a partial circuit input at each input logical value into a partial circuit according to the priority order.

In the step n31 of making a priority order of a partial circuit, a partial circuit which is connected to an input circuit from outside has a first priority. If a plurality of such partial circuits exist, a partial circuit on the upper stream side of a flow of signals has a priority. For instance, in a circuit shown in FIG. 1, both of partial circuits P01 and P02 are connected to an input circuit from outside, and an output signal of P01 is input into P02, while P02 is not input into P01. Therefore, the partial circuit P01 has a priority.

A priority order of a partial circuit is made along a flow of electricity and signals and, needless to say, partial circuits with the same priority order are possible.

In the step n32, an input/output relation of a partial circuit and a relation of a circuit input to a partial circuit input are calculated at each input logical value into a partial circuit from outside according to the priority order.

Then, an impossible combination of an input logical value in a partial circuit to be calculated is not calculated from the first depending on an output logical value from a prior partial circuit.

The reason for the above-mentioned is that an input logical value into a partial circuit to be calculated presently is determined by an output logical value from a prior partial circuit when an input/output relation of a partial circuit is calculated at each input logical value into a partial circuit from outside according to the priority order.

The present invention is described above based on several Embodiments and, needless to say, is not limited to the above-mentioned Embodiments. That is, the present invention can be described below.

(1) A processing of dividing into a partial circuit is executed as described below.
  1) A net list is read in.
  2) Each circuit element (instance) in the net list:
    a) making a database (which memorizes a name of the circuit element and a pointer (a null pointer in an initial stage) to the database of the net connecting to a source terminal and a drain terminal) of the circuit element;
    b) making the database (which memorizes a name of the net and a pointer to the database of more than one transistor connecting to the net) of each net connecting to a source terminal and a drain terminal if not making;
      registering a pointer (a null pointer in an initial stage) to a database of the circuit element under processing with the database of the net;
    d) registering a pointer to the database of the net connecting to a source terminal and a drain terminal with the database of the circuit element under processing;
    e) obtaining a state, in which a transistor and a net having a mutual connection are in the same partial circuit, through the above processing; and
    f) treating, however, as no connection in the case of having a connection through a power supply terminal or a ground terminal in a processing of dividing into a partial circuit (2) A processing of identifying is executed as described below.
First, the database, which is made in a processing of dividing into a partial circuit, is reuse
  a) Making ON a flag which indicates ON to a database of a transistor which is made ON at a logical value before a change (OFF in an initial stage);
  b) Making ON a flag which indicates ON to a database of a transistor which is made ON at a logical value after a change (OFF in an initial stage);
  c) Making a table on which a transistor and a terminal on a current path, on which all transistors are ON, are arranged in order after executing a search of a current path; and
  d) Executing the above a) to c) in each logical value before a change and each logical value after a change, and comparing each made table, and regarding the same table as the same current path.

(3) An embodiment is a hard disc and various memory media which are intended for not a work station and a calculation processing system having a function according to the present invention but a general-purpose microcomputer and a calculator, and make the microcomputer display a function according to the present invention after the hard disc and various memory media are read in the general-purpose microcomputer and the calculator (4) An embodiment has a function which enables various omissions of calculation as described in Embodiment 2 and 3 according to such stages of designing as a designing of a body, a designing of details and a designing of planning.

(5) A type of a semiconductor in a circuit is not merely P-type, N-type and it is possible to divide into more detailed kinds.

Moreover, a circuit can accept various connection lines and a capacity (a condenser). In this case, needless to say, an existence of these elements is considered in identifying a current path.

(6) An embodiment has a function which treats a particular exclusive circuit comprising a plurality of transistors as a transistor. Consequently, an output logical value change has not two stages of ON/OFF but a multitude of stages such as two inputs AND.

Furthermore, various values and instructions are memorized in a particular exclusive circuit as a transistor on a list of transistors. A processing according to memorized values and instructions is executed in calculating this circuit depending on the situation.

(7) Due to the situation of manufacturing, a constitution of the present invention can be composed of a plurality of constitutions and conversely, a plurality of constitutions can be united.

(8) An embodiment, wherein the order or the contents of processing is different although the same function and effect as various kinds of means in the present invention are obtained, can be adopted.

For instance, in calculating a power consumption characteristic, the means of identifying a partial circuit input and a current path are executed in a reverse order. That is, firstly the means of identifying a current path is executed and next, the means of identifying a partial circuit input is executed.

(9) A means of calculating a power consumption characteristic in the present invention can be united with other means of calculating. Consequently, a power consumption characteristic in a circuit, which is specified particularly by an input of, is calculated by other means of calculating depending on the situation, and a result of calculating by various kinds of means is output.

More specifically, a circuit A is calculated by a means in the present invention and a circuit B is calculated by other means, and as a result, the sum of a power consumption in the circuit A and the circuit B is output.

Therefore, it is possible to adapt flexibly to a partial modification (an amendment of the circuit A) of a large circuit (A+B).

(10) A result of calculating halfway and a memory before identifying a partial circuit input and a current path can be memorized in another domain, and the memory can be output by an instruction of an operator.

(11) A diode and a reactance can be treated as a component of a circuit. Accordingly, CPU makes a table and a database for these components and memorizes in a memory.

(12) A circuit including more than one partial circuit as described in Embodiments, such as a circuit in which the partial circuits P01 and P02 shown in FIGS. 1 and 17 are joined, can be treated as a partial circuit. In this case, an instruction of identifying the partial circuits by a user is input into a device in outputting a partial circuit which the device made to CRT for a check by the user.

(13) In identifying a current path, if it is possible to identify a resistance on a current path (a value of a resistance between a VDD and a ground by Kirchhoff's laws after replacing a transistor on a current path with a resistance between a source and a drain), namely, if an error is small, a current path can be identified.

Likewise, if a resistance on a current path in a partial circuit is higher than a resistance in another partial circuit (a current is low, a power consumption is low and thereby the power consumption is slight as compared to a power consumption of the whole cell), all input changes into the former partial circuit are identified.

What is claimed is:

1. A means for calculating a power consumption characteristic comprising:

means for memorizing a circuit network having a transistor and an input wiring and an output wiring;

a means for memorizing a circuit input which is a logical change given to the input wiring in said circuit network;

a means for making and memorizing a partial circuit into which a connection between a gate terminal and a terminal except a gate terminal is separated while holding a connection between gate terminals and a connection between terminals except a gate terminal at the transistor composing the circuit network memorized by said means for memorizing a circuit network;

a means for making and memorizing a partial circuit connection, which is a connection between said partial circuits, while considering a function and an adjustment of said means for making and memorizing a partial circuit;

a means for calculating and memorizing an input/output relation of a partial circuit, which is a correspondence of a logical value in a partial circuit input wiring for transmitting the logical value from outside to said partial circuit to a logical value in a partial circuit output wiring for transmitting the logical value from said partial circuit to outside, in each partial circuit, based on a memory in said means for making and memorizing a partial circuit;

a means for calculating and memorizing a relation of a circuit input to a partial circuit input, which is a correspondence of the logical change given to the input wiring in said circuit network to an input change m each partial circuit, based on a memory in said means for memorizing a circuit input and a memory in said means for making and memorizing a partial circuit connection and a memory in said means for calculating and memorizing an input/output relation of a partial circuit;

a means for calculating and memorizing a relation of a partial circuit input to a power consumption, which is a correspondence of an input logical change column in said partial circuit to a power consumption in each input logical change, through a predetermined procedure, based on a memory in said means for making and memorizing a partial circuit and a memory in said means for calculating and memorizing an input/output relation of a partial circuit; and a means for calculating and memorizing a circuit power consumption by regarding a sum of a power consumption at each partial circuit input corresponding to a circuit input as a power consumption in a circuit corresponding to the circuit input, based on a memory in said means for calculating and memorizing a relation of a circuit input to a partial circuit input and a memory in said means for calculating and memorizing a relation of a partial circuit input to a power consumption.

2. A means for calculating a power consumption characteristic according to claim 1, wherein:

said means for calculating and memorizing an input/output relation of a partial circuit comprises:

a minor means for making a priority order of a partial circuit along a flow of a current and a signal from an upper stream side to a lower stream side as regards a partial circuit memorized by said means for making and memorizing a partial circuit, based on a memory in said means for memorizing a circuit network and a memory in said means for making and memorizing a partial circuit connection; and a minor means for calculating and memorizing an input/output relation of a circuit except an imaginary part, which is a correspondence of an input logical value to an output logical value except calculating a logical value for outputting to outside as regards a combination of the logical value which is not actually input into each partial circuit in the priority order determined by said minor means for making a priority order of a partial circuit, sequentially in each partial circuit, based on the circuit input memorized by said means for memorizing a circuit input.

3. A means for calculating a power consumption characteristic according to claim 2, comprising a means for identifying a circuit which refers to a memory in said means for making and memorizing a partial circuit and a memory in said means for calculating and memorizing a relation of a circuit input to a partial circuit input while executing a function of said means for calculating and memorizing a relation of a circuit input to a partial circuit input before a function of said means for calculating and memorizing a relation of a partial circuit input to a power consumption; regards a partial circuit having the same constitution of a partial circuit and the same input change in a circuit input to a partial circuit as the same partial circuit; memorizes the part circuit again in said means for making and memorizing a partial circuit and said means for calculating and memorizing a relation of a circuit input to a partial circuit input; and functions so that said means for calculating and memorizing a circuit power consumption reuses a calculation of the same circuit.

4. A means for calculating a power consumption characteristic according to claim 3, wherein:

said means for calculating and memorizing a relation of a partial circuit input to a power consumption comprises:

a minor means for making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in said means for making and memorizing a partial circuit and a memory in said means for calculating and memorizing an input/output relation of a partial circuit;

a minor means for making and memorizing a relation of a partial circuit input to a current path, which is a correspondence of a memory in said means for calculating and memorizing an input/output relation of a partial circuit to a current path made by said minor means for making and memorizing a current path, in each partial circuit; and a minor means for calculating and memorizing a relation of a partial circuit input to a power consumption by calculating a power consumption in each current path through a relation between a current and a voltage with a use of a current path memorized by said minor means for making and memorizing a relation of a partial circuit input to a current path.

5. A means for calculating a power consumption characteristic according to claim 4, wherein:

said means for calculating and memorizing a relation of a partial circuit input to a power consumption comprises a minor means for identifying a partial circuit input which refers to a memory in said means for calculating and memorizing an input/output relation of a partial circuit and a memory in said minor means for making and memorizing a relation of a partial circuit input to a current path before a function of said minor means for calculating and memorizing a relation of a partial circuit input to a power consumption; regards a plurality of partial circuit inputs having the same current path as the same partial circuit input; memorizes the partial circuit input again in said means for calculating and memorizing an input/output relation of a partial circuit and said minor means for making and memorizing a relation of a partial circuit input to a current path; and functions so that said minor means for calculating and memorizing a relation of a partial circuit input to a power consumption reuses a calculation of a power consumption of the same partial circuit input.

6. A means for calculating a power consumption characteristic according to claim 5, wherein:

said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

7. A means for calculating a power consumption characteristic according to claim 4, wherein:

said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

8. A means for calculating a power consumption characteristic according to claim 2, wherein:

said means for calculating and memorizing a relation of a partial circuit input to a power consumption comprises:

a minor means for making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in said means for making and memorizing a partial circuit and a memory in said means for calculating and memorizing an input/output relation of a partial circuit;

a minor means for making and memorizing a relation of a partial circuit input to a current path, which is a correspondence of a memory in said means for calculating and memorizing an input/output relation of a partial circuit to a current path made by said minor means for making and memorizing a current path, in each partial circuit; and a minor means for calculating and memorizing a relation of a partial circuit input to a power consumption by calculating a power consumption in each current path through a relation between a current and a voltage with a use of a current path memorized by said minor means for making and memorizing a relation of a partial circuit input to a current path.

9. A means for calculating a power consumption characteristic according to claim 8, wherein:

said means for calculating and memorizing a relation of a partial circuit input to a power consumption comprises a minor means for identifying a partial circuit input which refers to a memory in said means for calculating and memorizing an input/output relation of a partial circuit and a memory in said minor means for making and memorizing a relation of a partial circuit input to a current path before a function of said minor means for calculating and memorizing a relation of a partial circuit input to a power consumption; regards a plurality of partial circuit inputs having the same current path as the same partial circuit input; memorizes the partial circuit input again in said means fox calculating and memorizing an input/output relation of a partial circuit and said minor means for making and memorizing a relation of a partial circuit input to a current path; and functions so that said minor means for calculating and memorizing a relation of a partial circuit input to a power consumption reuses a calculation of a power consumption of the same partial circuit input.

10. A means for calculating a power consumption characteristic according to claim 9, wherein:

said means for calculating and memorizing a relation of a partial circuit input to a power consumption comprises a minor means for identifying a curt path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memories the current path again in said minor means for making and memorizing a current path or said minor means for making and memorizing a relation of a partial circuit input to a current path.

11. A means for calculating a power consumption characteristic according to claim 8, wherein:

said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

12. A means for calculating a power consumption characteristic according to claim 1, comprising:

a means for identifying a circuit which refers to a memory in said means for making and memorizing a partial circuit and a memory in said means for calculating and memorizing a relation of a circuit input to a partial circuit input while executing a function of said means for calculating and memorizing a relation of a circuit input to a partial circuit input before a function of said means for calculating and memorizing a relation of a partial circuit input to a power consumption; regards a partial circuit having the same constitution of a partial circuit and the same input change in a circuit input to a partial circuit as the same partial circuit; memorizes the partial circuit again in said means for making and memorizing a partial circuit and said means for calculating and memorizing a relation of a circuit input to a partial circuit input; and functions so that said means for calculating and memorizing a circuit power consumption reuses a calculation of the same circuit.

13. A means for calculating a power consumption characteristic according to claim 12, wherein:

said means for calculating and memorizing a relation of a partial circuit input to a power consumption comprises:

a minor means for making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in said means for making and memorizing a partial circuit and a memory in said means for calculating and memorizing an input/output relation of a partial circuit;

a minor means for making and memorizing a relation of a partial circuit input to a current path, which is a correspondence of a memory in said means for calculating and memorizing an input/output relation of a partial circuit to a current path made by said minor means for making and memorizing a current path, in each partial circuit; and a minor means for calculating and memorizing a relation of a partial circuit input to a power consumption by calculating a power consumption in each current path through a relation between a current and a voltage with a use of a current path memorized by said minor means for making and memorizing a relation of a partial circuit input to a current path.

14. A means for calculating a power consumption characteristic according to claim 13, wherein:

said means for calculating and memorizing a relation of a partial circuit input to a power consumption comprises a minor means for identifying a partial circuit input which refers to a memory in said means for calculating and memorizing an input/output relation of a partial circuit and a memory in said minor means for making and memorizing a relation of a partial circuit input to a current path before a function of said minor means for calculating and memorizing a relation of a partial circuit input to a power consumption; regards a plurality of partial circuit inputs having the same current path as the same partial circuit input; memorizes the partial circuit input again in said means for calculating and memorizing an input/output relation of a partial circuit and said minor means for making and memorizing a relation of a partial circuit input to a current path; and functions so that said minor means for calculating and memorizing a relation of a partial circuit input to a power consumption reuses a calculation of a power consumption of the same partial circuit input.

15. A means for calculating a power consumption characteristic according to claim 14, wherein:

said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memories the current path again in said minor means for making and memorizing a current path or said minor means for making and memorizing a relation of a partial circuit input to a current path.

16. A means for calculating a power consumption characteristic according to claim 13, wherein:
said means for calculating and memorizing a relation of a part circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

17. A means for calculating a power consumption characteristic according to claim 1, wherein:
said means for calculating and memorizing a relation of a partial circuit input to a power consumption comprises:
a minor means for making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in said means for making and memorizing a partial circuit and a memory in said means for calculating and memorizing an input/output relation of a partial circuit;
a minor means for making and memorizing a relation of a partial circuit input to a current path, which is a correspondence of a memory in said means for calculating and memorizing an input/output relation of a part circuit to a current path made by said minor means for making and memorizing a current path, in each partial circuit; and
a minor means for calculating and memorizing a relation of a partial circuit input to a power consumption by calculating a power consumption in each current path through a relation between a current and a voltage with a use of a current path memorized by said minor means for making and memorizing a relation of a partial circuit input to a current path.

18. A means for calculating a power consumption characteristic according to claim 17, wherein:
said means for calculating and memorizing a relation of a partial circuit input to a power consumption comprises a minor means for identifying a partial circuit input which refers to a memory in said means for calculating and memorizing an input/output relation of a partial circuit and a memory in said minor means for making and memorizing a relation of a partial circuit input to a current path before a function of said minor means for calculating and memorizing a relation of a partial circuit input to a power consumption; regards a plurality of partial circuit inputs having the same current path as the same partial circuit input; memorizes the partial circuit input again in said means for calculating and memorizing an input/output relation of a partial circuit and said minor means for making and memorizing a relation of a partial circuit input to a current path; and functions so that said minor means for calculating and memorizing a relation of a partial circuit, input to a power consumption reuses a calculation of a power consumption of the same partial circuit input.

19. A means for calculating a power consumption characteristic according to claim 18, wherein:
said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

20. A means for calculating a power consumption characteristic according to claim 17, wherein:
said means for calculating and memorizing a relation of a partial circuit input to a power consumption comprises a minor means for identifying a current path which refers to a memory in said minor means for making and memorizing a current path or a memory in said minor means for making and memorizing a relation of a partial circuit input to a current path before a function of said minor means for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor means for making and memorizing a current path or said minor means for making and memorizing a relation of a partial circuit input to a current path.

21. A means for calculating a power consumption characteristic comprising:
a means for memorizing a partial circuit which memorizes a plurality of partial circuits having a transistor and an input wiring and an output wiring;
a means for memorizing a partial circuit input which is a logical change given to the input wiring in said partial circuit;
a means for calculating and memorizing an input/output relation of a partial circuit, which is a correspondence of a logical value from outside to said partial circuit to a logical value from said partial circuit to outside, based on a memory in said means for memorizing a partial circuit and a memory in said means for memorizing a partial circuit input;
a means for making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, after referring to a memory in sad means for memorizing a partial circuit and a memory in said means for calculating and memorizing an input/output relation of a partial circuit;

a means for making and memorizing a relation of a partial circuit input to a current path which is a correspondence of a memory in said means for calculating and memorizing an input/output relation of a partial circuit to a current path made by said means for calculating and memorizing a current path;

a means for identifying a partial circuit input which refers to a memory in said means for making and memorizing a relation of a partial circuit input to a current path before calculating a current path at each partial circuit input, regards a plurality of partial circuit inputs having the same current path as the same partial circuit input, and memorizes the partial circuit input again in said means for making and memorizing a relation of a partial circuit input to a current path; and a means for calculating a partial circuit power consumption in a current path at each partial circuit input after a function of said means for identifying a partial circuit input.

22. A means for calculating a power consumption characteristic according to claim 21, comprising:

a means for identifying a current path which functions so that said means for making and memorizing a relation of a partial circuit input to a current path regards a plurality of current paths having the same number of transistors composing said current path, the same direction of a current flowing between an output wiring and a transistor, and the same current characteristic of all transistors in the same order as the same current path, based on a memory in said means for making and memorizing a current path before a function of said means for identifying a partial circuit input.

23. A method of calculating a power consumption characteristic comprising the steps of:

memorizing a circuit network having a transistor and an input wiring and an output wiring;

memorizing a circuit input which is a logical change given to the input wiring in said circuit network;

making and memorizing a partial circuit into which a connection between a gate terminal and a terminal except a gate terminal is separated while holding a connection between gate terminals and a connection between terminals except a gate terminal at the transistor composing the circuit network memorized by said step for memorizing a circuit network;

making and memorizing a partial circuit connection, which is a connection between said partial circuits, while considering a function and an adjustment of said step for making and memorizing a partial circuit;

calculating and memorizing an input/output relation of a partial circuit, which is a correspondence of a logical value in a partial circuit input wiring for transmitting the logical value from outside to said partial circuit to a logical value in a partial circuit output wiring for transmitting the logical value from said partial circuit to outside, in each partial circuit, based on a memory in said step for making and memorizing a partial circuit;

calculating and memorizing a relation of a circuit input to a partial circuit input, which is a correspondence of the logical change given to the input wiring in said circuit network to an input change in each partial circuit, based on a memory in said step for memorizing a circuit input and a memory in said step for making and memorizing a partial circuit connection and a memory in said step for calculating and memorizing an input/output relation of a partial circuit;

circulating and memorizing a relation of a partial circuit input to a power consumption, which is a correspondence of an input logical change column in said partial circuit to a power consumption in each input logical change, through a predetermined procedure, based on a memory in said step for making and memorizing a partial circuit and a memory in said step for calculating and memorizing an input/output relation of a partial circuit; and calculating and memorizing a circuit power consumption by regarding a sum of a power consumption at each partial circuit input corresponding to a circuit input as a power consumption in a circuit corresponding to the circuit input, based on a memory in said step for calculating and memorizing a relation of a civet input to a partial circuit input and a memory in said step for calculating and memorizing a relation of a partial circuit input to a power consumption.

24. A method of calculating a power consumption characteristic according to claim 23, wherein:

said step of calculating and memorizing an input/output relation of a partial circuit comprises the minor steps of:

making a priority order of a partial circuit along a flow of a current and a signal from an upper stream side to a lower stream side as regards a partial circuit memorized by said step for making and memorizing a partial circuit, based on a memory in said step for memorizing a circuit network and a memory in said step for making and memorizing a partial circuit connection; and calculating and memorizing an input/output relation of a circuit except an imaginary part, which is a correspondence of an input logical value to an output logical value except calculating a logical value for outputting to outside as regards a combination of the logical value which is not actually input into each partial circuit in the priority order determined by said minor step for making a priority order of a partial circuit, sequentially in each partial circuit, based on the circuit input memorized by said step for memorizing a circuit input.

25. A method of calculating a power consumption characteristic according to claim 24, comprising:

a step of identifying a circuit which refers to a memory in said step for making and memorizing a partial circuit and a memory in said step for calculating and memorizing a relation of a circuit input to a partial circuit input while executing a function of said step for calculating and memorizing a relation of a circuit input to a partial circuit input before a function of sad step for calculating and memorizing a relation of a partial circuit input to a power consumption; regards a partial circuit having the same constitution of a partial circuit and the same input change in a circuit input to a partial circuit as the same partial circuit; memorizes the partial circuit again in sad step for making and memorizing a partial circuit and said step for calculating and memorizing a relation of a circuit input to a partial circuit input; and functions so that said step for calculating and memorizing a circuit power consumption reuses a calculation of the same circuit.

26. A method of calculating a power consumption characteristic according to claim 25, wherein:
said step of calculating and memorizing a relation of a partial circuit input to a power consumption comprises the minor steps of:
making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in sad step for making and memorizing partial circuit and a memory in said step for calculating and memorizing an input/output relation of a partial circuit;
making and memorizing a relation of a partial circuit input to a current path, which is a correspondence of a memory in said step for calculating and memorizing an input/output relation of a partial circuit to a current path made by said minor step for making and memorizing a current path, in each partial circuit; and
calculating and memorizing a relation of a partial circuit input to a power consumption by calculating a power consumption in each current path through a relation between a current and a voltage with a use of a current path memorized by said minor step for making and memorizing a relation of a partial circuit input to a current path.

27. A method of calculating a power consumption characteristic according to claim 26, wherein:
said step of calculating and memorizing a relation of a partial circuit input to a power consumption comprises a minor step of identifying a partial circuit input which refers to a memory in said step for calculating and memorizing an input/output relation of a partial circuit and a memory in said minor step for making and memorizing a relation of a partial circuit input to a current path before a function of said minor step for calculating and memorizing a relation of a partial circuit input to a power consumption; regards a plurality of partial circuit inputs having the same current path as the same partial circuit input; memorizes the partial circuit input again in said step for calculating and memorizing an input/output relation of a partial circuit and said minor step for making and memorizing a relation of a partial circuit input to a current path; and functions so that said minor step for calculating and memorizing a relation of a partial circuit input to a power consumption reuses a calculation of a power consumption of the same partial circuit input.

28. A method of calculating a power consumption characteristic according to claim 27, wherein:
said step of calculating and memorizing a relation of a partial circuit input to a power consumption comprises a minor step of identifying a current path which refers to a memory in said minor step for making and memorizing a current path or a memory in said minor step for making and memorizing a relation of a partial circuit input to a current path before a function of said minor step for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor step for making and memorizing a current path or said minor step for making and memorizing a relation of a partial circuit input to a current path.

29. A method of calculating a power consumption characteristic according to claim 23, comprising:
a step of identifying a circuit which refers to a memory in said step for making and memorizing a partial circuit and a memory in said step for calculating and memorizing a relation of a circuit input to a partial circuit input while executing a function of said step for calculating and memorizing a relation of a circuit input to a partial circuit input before a function of said step for calculating and memorizing a relation of a partial circuit input to a power consumption; regards a partial circuit having the same constitution of a partial circuit and the same input change in a circuit input to a partial circuit as the same partial circuit; memorizes the partial circuit again in said step for making and memorizing a partial circuit and said step for calculating and memorizing a relation of a circuit input to a partial circuit input; and functions so that said step for calculating and memorizing a circuit power consumption reuses a calculation of the same circuit.

30. A method of calculating a power consumption characterstic according to claim 29, wherein:
said step of calculating and memorizing a relation of a partial circuit input to a power consumption comprises the minor steps of:
making and memorizing a current path, which is a joined path of a path from a power supply wiring to a ground wiring having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, in each partial circuit after referring to a memory in said step for making and memorizing a partial circuit and a memory in said step for calculating and memorizing an input/output relation of a partial circuit;
making and memorizing a relation of a partial circuit input to a current path, which is a correspondence of a memory in said step for calculating and memorizing an input/output relation of a partial circuit to a current path made by said minor step for making and memorizing a current path, in each partial circuit; and
calculating and memorizing a relation of a partial circuit input to a power consumption by calculating a power consumption in each current path through a relation between a current and a voltage with a use of a current path memorized by said minor step for making and memorizing a relation of a partial circuit input to a current path.

31. A method of calculating a power consumption characteristic according to claim 30, wherein:
said step of calculating and memorizing a relation of a partial circuit input to a power consumption comprises a minor step of identifying a partial circuit input which refers to a memory in said step for calculating and memorizing an input/output relation of a partial circuit and a memory in said minor step for making and memorizing a relation of a partial circuit input to a current path before a function of said minor step for calculating and memorizing a relation of a partial circuit input to a power consumption; regards a plurality of partial circuit inputs having the same current path as the same partial circuit input; memorizes the partial circuit input again in said step for calculating and memorizing an input/output relation of a partial circuit and said minor step for making and memorizing a relation of a partial circuit input to a current path; and functions so that said minor step for calculating and memorizing a relation of a partial circuit input to a power consumption reuses a calculation of a power consumption of the same partial circuit input.

32. A method of calculating a power consumption characteristic according to claim 31, wherein:

said step of calculating and memorizing a relation of a partial circuit input to a power consumption comprises a minor step of identifying a current path which refers to a memory in said minor step for making and memorizing a current path or a memory in said minor step for making and memorizing a relation of a partial circuit input to a current path before a function of said minor step for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor step for making and memorizing a current path or said minor step for making and memorizing a relation of a partial circuit input to a current path.

33. A method of calculating a power consumption characteristic according to claim 30, wherein said step of calculating and memorizing a relation of a partial circuit input to a power consumption comprises a minor step of identifying a current path which refers to a memory in said minor step for making and memorizing a current path or a memory in said minor step for making and memorizing a relation of a partial circuit input to a current path before a function of said minor step for calculating and memorizing a relation of a partial circuit input to a power consumption; regards a plurality of current paths having the same number of transistors composing said current path, the same direction of a current flowing between an output wiring and a transistor, and the same current characteristic of all transistors in the same order as the same current path; and memorizes the current path again in said minor step for making and memorizing a current path or said minor step for making and memorizing a relation of a partial circuit input to a current path.

34. A method of calculating a power consumption characteristic comprising the steps of:

memorizing a partial circuit which memorizes a plurality of partial circuits having a transistor and an input wiring and an output wiring;

memorizing a partial circuit input which is a logical change given to the input wiring in said partial circuit;

calculating and memorizing an input/output relation of a partial circuit, which is a correspondence of a logical value from outside to said partial circuit to a logical value from said partial circuit to outside, based on a memory in said step for memorizing a partial circuit and a memory in said step for memorizing a partial circuit input;

making and memorizing a current path, which is a joined path of a path from a power supply wiring to a ground wing having a transistor driven by either of a logical value before a change and a logical value after a change of said partial circuit input in a partial circuit as well as a path from a power supply wiring to an output wiring or a path from an output wiring to a ground wiring having a transistor driven by a logical value after a change in said partial circuit, after referring to a memory in said step for memorizing a partial circuit and a memory in said step for calculating and memorizing an input/output relation of a partial circuit;

making and memorizing a relation of a partial circuit input to a current path which is a correspondence of a memory in said step for calculating and memorizing an input/output relation of a partial circuit to a current path made by said step for calculating and memorizing a current path;

identifying a partial circuit input which refers to a memory in said step for making and memorizing a relation of a partial circuit input to a current path before calculating a current path at each partial circuit input, regards a plurality of partial circuit inputs having the same current path as the same partial circuit input, and memorizes the partial circuit input again in said step for making and memorizing a relation of a partial circuit input to a current path; and calculating a partial circuit power consumption in a current path at each partial circuit input after a function of said step for identifying a partial circuit input.

35. A method of calculating a power consumption characteristic according to claim 34, comprising:

a step of identifying a current path which functions so that said step for making and memorizing a relation of a partial circuit input to a current path regards a plurality of current paths having the same number of transistors composing said current path, the same direction of a current flowing between an output wiring and a transistor, and the same current characteristic of a transistors in the same order as the same current path, based on a memory in said step for making and memorizing a current path before a function of said step for identifying a partial circuit input.

* * * * *